(12) United States Patent
Lee et al.

(10) Patent No.: US 9,929,022 B2
(45) Date of Patent: Mar. 27, 2018

(54) SEMICONDUCTOR CHIP PACKAGE AND METHOD OF MANUFACTURING THE SAME

(71) Applicants: Seok-hyun Lee, Hwaseong-si (KR); Yun-seok Choi, Hwaseong-si (KR); Tae-je Cho, Yongin-si (KR); Jin-woo Park, Seoul (KR)

(72) Inventors: Seok-hyun Lee, Hwaseong-si (KR); Yun-seok Choi, Hwaseong-si (KR); Tae-je Cho, Yongin-si (KR); Jin-woo Park, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/231,880

(22) Filed: Aug. 9, 2016

(65) Prior Publication Data

US 2017/0069532 A1    Mar. 9, 2017

(30) Foreign Application Priority Data

Sep. 9, 2015 (KR) .................. 10-2015-0127707

(51) Int. Cl.
*H01L 21/768* (2006.01)
*H01L 21/311* (2006.01)
(Continued)

(52) U.S. Cl.
CPC ...... *H01L 21/31144* (2013.01); *H01L 21/486* (2013.01); *H01L 21/4853* (2013.01);
(Continued)

(58) Field of Classification Search
CPC .................. H01L 24/97; H01L 24/92; H01L 2924/15311; H01L 2924/0002;
(Continued)

(56) References Cited

U.S. PATENT DOCUMENTS 7,888,184 B2    2/2011   Shim et al.
8,435,837 B2    5/2013   Tsai et al.
(Continued)

FOREIGN PATENT DOCUMENTS

CN    101888748 A  * 11/2010  ............... H05K 3/40
KR    10-1145041        5/2012
(Continued)

*Primary Examiner* — Caridad Everhart
(74) *Attorney, Agent, or Firm* — Muir Patent Law, PLLC

(57) ABSTRACT

A method of manufacturing a semiconductor package includes: providing a package substrate having a first surface and a second surface opposite the first surface; providing a first semiconductor chip on the package substrate, the first semiconductor chip having a first surface facing the second surface of the package substrate, a second surface opposite the first surface of the first semiconductor chip, and lateral surfaces extending from the first surface of the first semiconductor chip to the second surface of the first semiconductor chip; providing a molding layer covering the lateral surfaces of the first semiconductor chip and covering the second surface of the package substrate; and providing a plurality of through-molding conductive vias outside the lateral surfaces of the first semiconductor chip. The through-molding conductive vias may be formed before forming the molding layer and may pass through the molding layer. The through-molding conductive vias may extend beyond a first surface of the molding layer.

20 Claims, 33 Drawing Sheets

(51) Int. Cl.
*H01L 21/56* (2006.01)
*H01L 23/00* (2006.01)
*H01L 23/31* (2006.01)
*H01L 23/522* (2006.01)
*H01L 23/498* (2006.01)
*H01L 21/48* (2006.01)
*H01L 23/538* (2006.01)

(52) U.S. Cl.
CPC .... *H01L 23/49811* (2013.01); *H01L 23/5389* (2013.01); *H01L 24/19* (2013.01); *H01L 24/20* (2013.01); *H01L 24/96* (2013.01); *H01L 24/97* (2013.01); *H01L 21/561* (2013.01); *H01L 21/568* (2013.01); *H01L 23/49816* (2013.01); *H01L 2224/04105* (2013.01); *H01L 2224/12105* (2013.01); *H01L 2224/73267* (2013.01); *H01L 2224/92244* (2013.01); *H01L 2224/97* (2013.01); *H01L 2225/1035* (2013.01); *H01L 2225/1041* (2013.01); *H01L 2225/1058* (2013.01); *H01L 2924/1815* (2013.01)

(58) Field of Classification Search
CPC ....... H01L 2224/73265; H01L 2224/97; H01L 2224/11; H01L 2224/92; H01L 2224/0231; H01L 2224/05552; H01L 24/19; H01L 24/96; H01L 23/49816; H01L 21/568; H01L 21/561; H01L 21/486; H01L 21/4853; H01L 21/31144; H01L 2924/181; H01L 2224/83; H01L 2224/73267
See application file for complete search history.

(56) References Cited

U.S. PATENT DOCUMENTS

| | | | |
|---|---|---|---|
| 8,446,017 B2 | 5/2013 | Paek et al. | |
| 8,482,115 B2 | 7/2013 | Pagaila | |
| 8,581,370 B2 | 11/2013 | Pagaila et al. | |
| 9,006,872 B2 | 4/2015 | Kwon | |
| 2006/0266938 A1* | 11/2006 | Abela | H01L 27/14618 250/239 |
| 2008/0303163 A1* | 12/2008 | Liu | H01L 21/76898 257/772 |
| 2010/0289126 A1* | 11/2010 | Pagaila | H01L 23/49822 257/659 |
| 2010/0314352 A1* | 12/2010 | Chen | H01L 21/6835 216/13 |
| 2012/0241973 A1* | 9/2012 | Chua | H01L 23/3128 257/774 |
| 2012/0286407 A1* | 11/2012 | Choi | H01L 21/4853 257/670 |
| 2013/0307140 A1 | 11/2013 | Huang et al. | |
| 2014/0070407 A1 | 3/2014 | Lee et al. | |
| 2014/0077389 A1* | 3/2014 | Shim, II | H01L 23/49816 257/774 |
| 2014/0183750 A1* | 7/2014 | McConnelee | H01L 23/5383 257/773 |
| 2016/0190108 A1* | 6/2016 | Lee | H01L 25/16 257/692 |

FOREIGN PATENT DOCUMENTS

| | | |
|---|---|---|
| KR | 10-1494411 | 2/2015 |
| KR | 10-1494413 | 2/2015 |
| KR | 10-1515777 | 5/2015 |

* cited by examiner

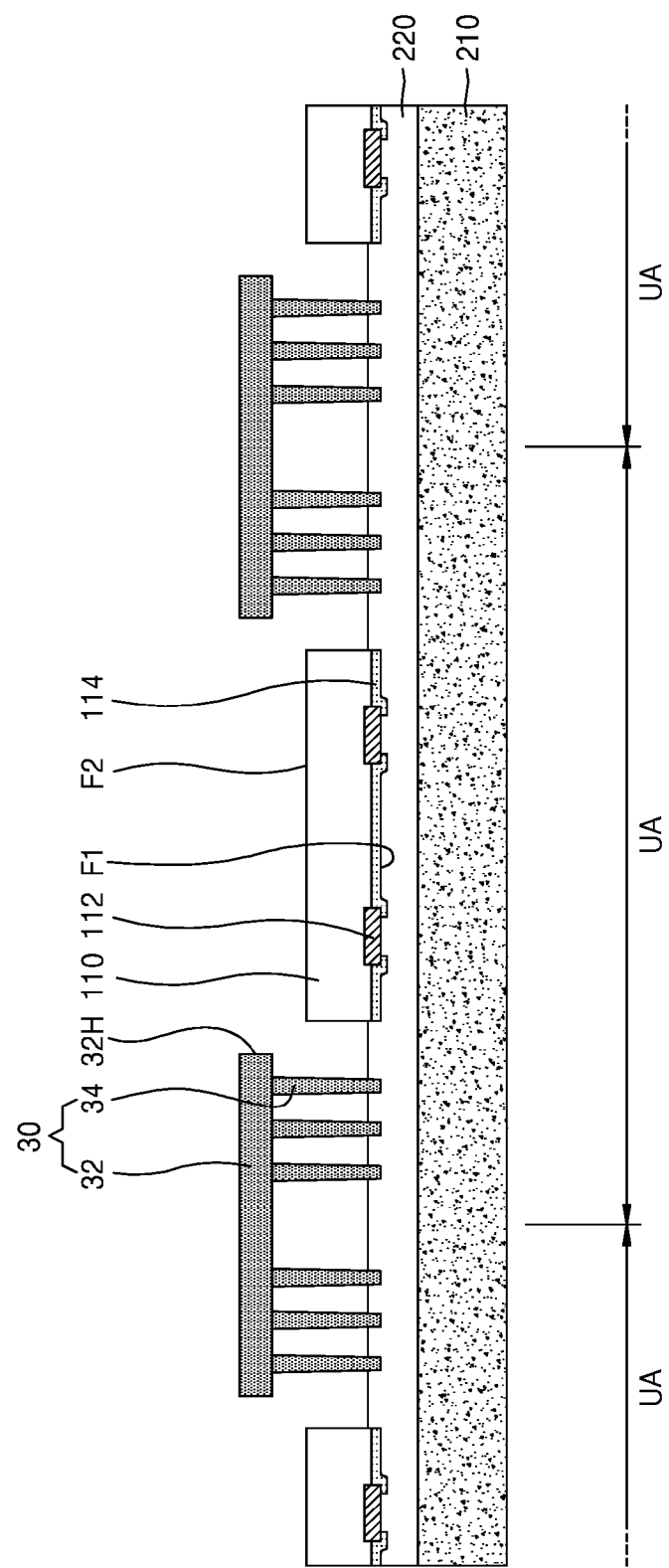

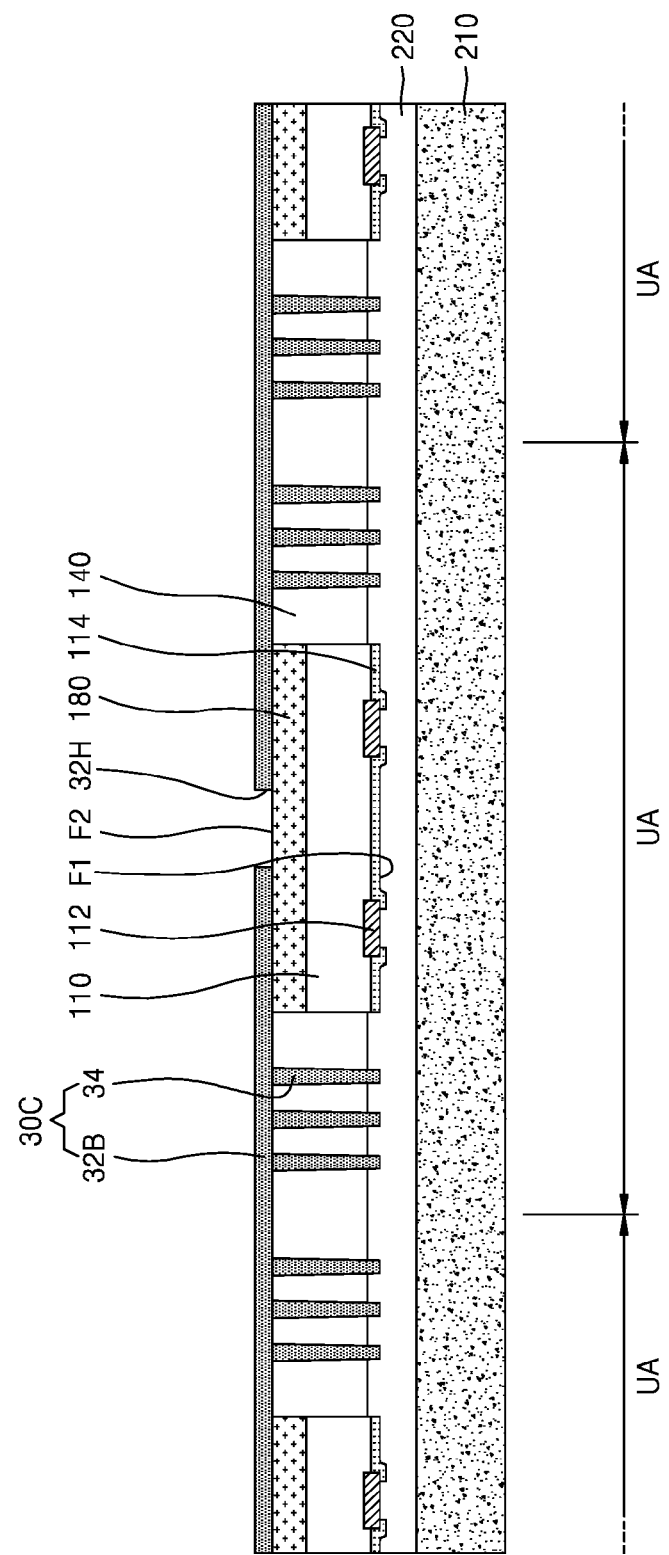

SEMICONDUCTOR CHIP PACKAGE AND METHOD OF MANUFACTURING THE SAME

CROSS-REFERENCE TO RELATED APPLICATION

This application claims priority to Korean Patent Application No. 10-2015-0127707, filed on Sep. 9, 2015, in the Korean Intellectual Property Office, the disclosure of which is incorporated herein in its entirety by reference.

BACKGROUND

The present disclosure relates to a semiconductor chip package and a method of manufacturing the same, and more particularly, to a semiconductor chip package including a semiconductor chip having a connection terminal of a fine pitch and a method of manufacturing the same.

As electronic industries develop rapidly and user demands increase, electronic devices are miniaturized even more and can be more prone to multifunctions. Therefore, both demand for miniaturization, and multifunctions of semiconductor devices used for electronic devices also increases. Accordingly, a semiconductor chip having connection terminals of a fine pitch are desirable, and connection components such as wiring patterns and connection vias inside a semiconductor package including the semiconductor chip can benefit from having a fine pitch.

SUMMARY

Aspects of the inventive concept provide a semiconductor chip package including a connection via of a fine pitch and a method of manufacturing the same.

According to an aspect of the inventive concept, a semiconductor chip package includes: a semiconductor chip having a first surface, which is an active surface, and a second surface opposite to the first surface, and disposed such that the first surface faces upward; a molding member surrounding a lateral side of the semiconductor chip; and a connection via disposed laterally outside the semiconductor chip and passing through the molding member, the connection via having an upper end portion corresponding to a top surface of the molding member, and a lower end portion opposite to the upper end portion and corresponding to a bottom surface of the molding member opposite the top surface, wherein the lower end portion of the connection via extends to a level lower than the bottom surface of the molding member.

According to another aspect of the inventive concept, a semiconductor chip package includes: a semiconductor chip having a first surface, which is an active surface, and a second surface opposite to the first surface, and disposed such that the first surface faces a first direction; a molding member surrounding a lateral side of the semiconductor chip; and a connection via disposed around the semiconductor chip and passing through the molding member, the connection via having a first end portion that is closer to the first surface of the semiconductor chip, and a second end portion opposite to the first end portion, wherein a width of the first end portion of the connection via is less than a width of the second end portion of the connection via.

According to another aspect of the inventive concept, there is provided a method of manufacturing a semiconductor chip package, the method including: attaching a semiconductor chip on a carrier substrate; forming a preliminary connection via structure including a connection via portion and a support portion integrally connected to the connection via portion; attaching the preliminary connection via structure on the carrier substrate such that the connection via portion is disposed laterally outside of the semiconductor chip; forming a molding member that surrounds the semiconductor chip and the preliminary connection via structure; and forming a connection via that passes through the molding member by removing an upper portion of the molding member and an upper portion of the preliminary connection via structure.

According to some example embodiments, a method of manufacturing a semiconductor package includes: providing a package substrate having a first surface and a second surface opposite the first surface; providing a first semiconductor chip on the package substrate, the first semiconductor chip having a first surface facing the second surface of the package substrate, a second surface opposite the first surface of the first semiconductor chip, and lateral surfaces extending from the first surface of the first semiconductor chip to the second surface of the first semiconductor chip; providing a molding layer covering the lateral surfaces of the first semiconductor chip and covering the second surface of the package substrate; and providing a plurality of through-molding conductive vias outside the lateral surfaces of the first semiconductor chip. The through-molding conductive vias may be formed before forming the molding layer and may pass through the molding layer.

According to certain exemplary embodiments, a method includes: providing a package substrate having a first surface and a second surface opposite the first surface; providing a first semiconductor chip on the package substrate, the first semiconductor chip having a first surface facing the second surface of the package substrate, a second surface opposite the first surface, and lateral surfaces extending from the first surface of the first semiconductor chip to the second surface of the first semiconductor chip; providing a molding layer covering the lateral surfaces of the first semiconductor chip and covering the second surface of the package substrate, wherein a first surface of the molding layer faces the second surface of the package substrate; and providing a plurality of through-molding conductive vias that pass through the molding layer and are located outside the lateral surfaces of the first semiconductor chip. The through-molding conductive vias may extend beyond the first surface of the molding layer.

BRIEF DESCRIPTION OF THE DRAWINGS

Example embodiments of the inventive concept will be more clearly understood from the following detailed description taken in conjunction with the accompanying drawings in which:

FIGS. 10A to 10G are cross-sectional views illustrating a method of manufacturing a semiconductor chip package according to an example embodiment;

FIGS. 11A to 11E are cross-sectional views illustrating a method of manufacturing a semiconductor chip package according to an example embodiment.

Figure 1A:
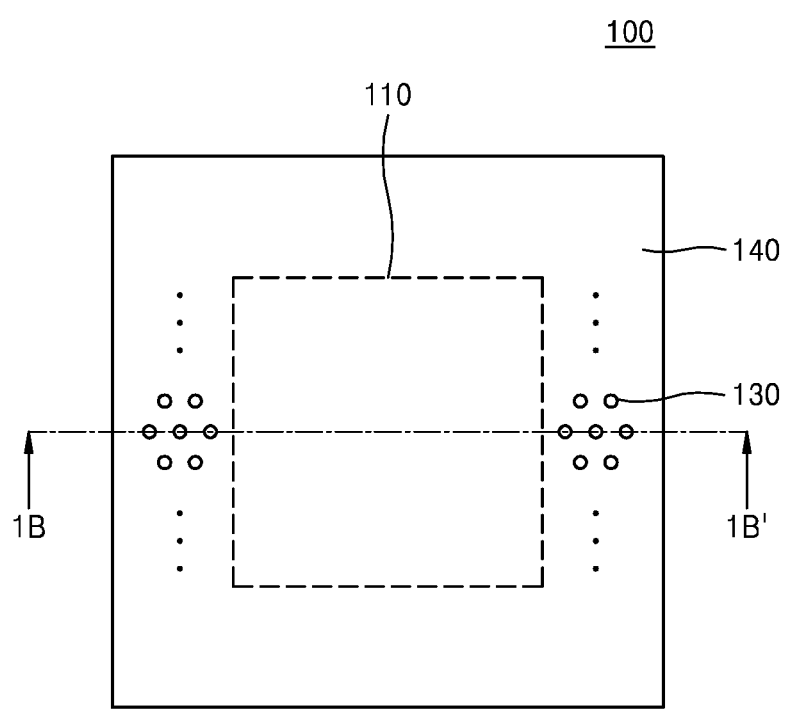
FIG. 1A is a plan view illustrating a semiconductor chip package according to an example embodiment.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

DETAILED DESCRIPTION

As used herein, the term "and/or" includes any and all combinations of one or more of the associated listed items. Expressions such as "at least one of" when preceding a list of elements, modify the entire list of elements and do not modify the individual elements of the list.

For sufficient understanding of the construction and effect of the inventive concept, example embodiments are described with reference to the accompanying drawings. However, the inventive concept is not limited to example embodiments provided below, but may be implemented in various forms and various changes may be made. Descriptions of example embodiments are provided to make disclosure of the inventive concept complete and inform a person of ordinary skill in the art of the scope of the inventive concept. Sizes of components in the drawings may be exaggerated for convenience of explanation, and a ratio of each component may be exaggerated or reduced.

It will be understood that when a component is referred to as being "on" or "connected to" another component, the component may be directly on the other component or may be directly connected to the other component, but intervening components may be present therebetween. In contrast, when a component is referred to as being "directly on" or "directly connected" another component, or as "contacting" or "in contact with" another component, it is understood that intervening components do not exist therebetween. Other expressions that explain a relation between components, for example, "between', "directly between", etc. may be understood likewise.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

As used herein, the singular forms "a," "an" and "the" are intended to include the plural forms as well, unless the context clearly indicates otherwise. It will be understood that the terms "includes," "including," "comprises," and/or "comprising" used herein specify the presence of stated features, numbers, operations, components, parts, or a combination thereof, and it may be construed that one or more other features, numbers, operations, components, parts, or a combination thereof may be added.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, levels, sizes, amounts, or other measures do not necessarily mean an exactly identical orientation, layout, location, shape, level, size, amount, or other measure, but are intended to encompass nearly identical orientation, layout, location, shapes, levels, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1B:
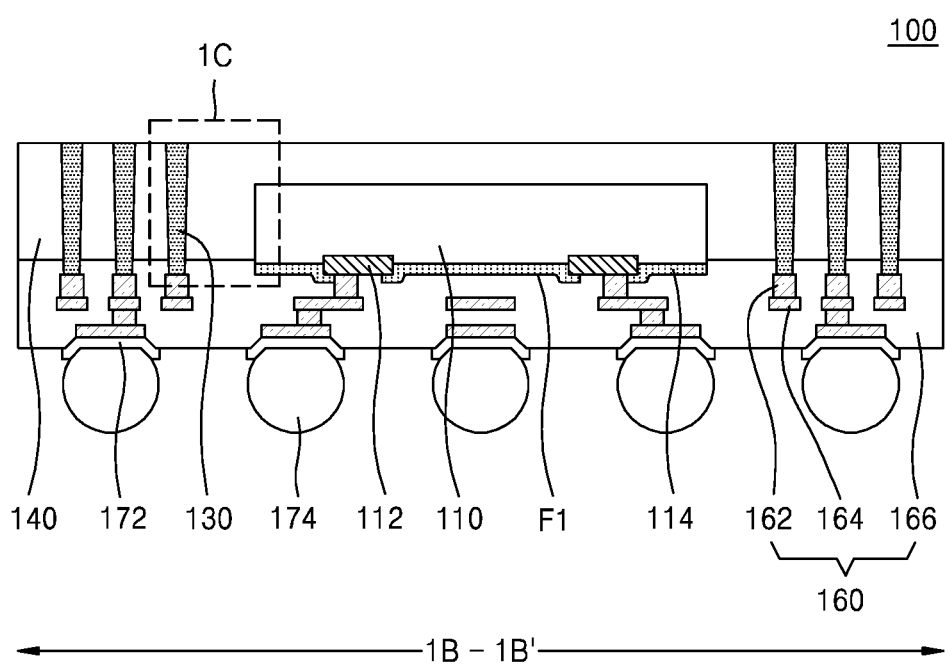
FIG. 1B is a cross-sectional view taken along a line 1B-1B' of FIG. 1A, according to an example embodiment.
Figure 1C:
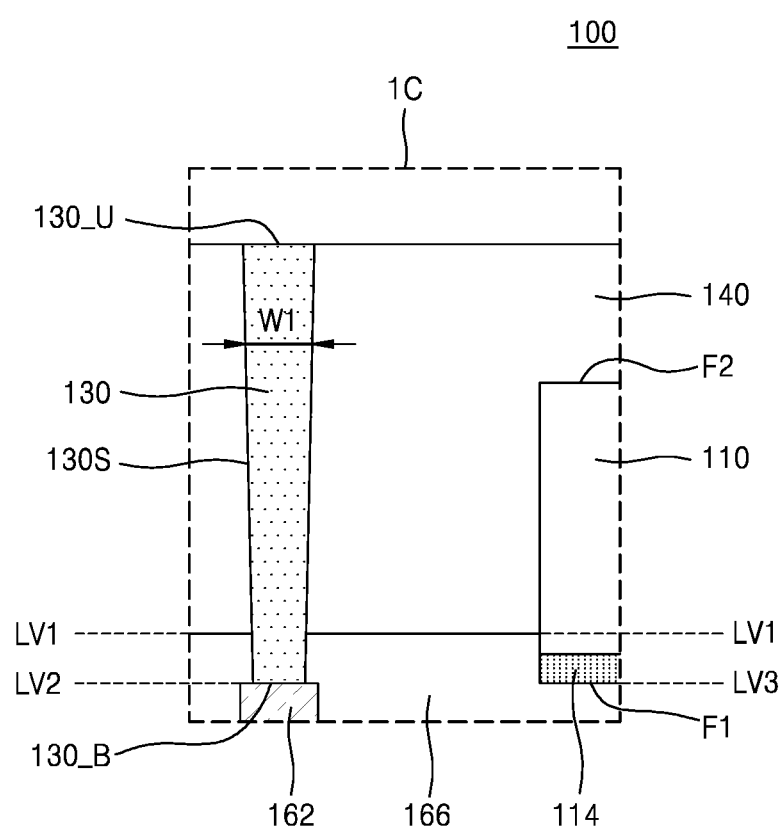
FIG. 1C is an enlarged view of a portion 1C of FIG. 1B, according to an example embodiment.

FIG. 1A is a plan view illustrating a semiconductor chip package 100 according to an example embodiment, FIG. 1B is a cross-sectional view taken along a line 1B-1B' of FIG. 1A, and FIG. 1C is an enlarged view of a portion 1C of FIG. 1B.

Referring to FIGS. 1A to 1C, the semiconductor chip package 100 may include a semiconductor chip 110, a connection via 130, a molding member 140, a redistribution layer 160, and a connection terminal 174.

The semiconductor chip 110 may include a first surface F1 and a second surface F2 which are opposite to each other, and the first surface F1 may be a surface corresponding to an active surface of the semiconductor chip 110. The first surface F1 may be referred to as a top surface, and the second surface F2 may be referred to as a bottom surface. The semiconductor chip 110 may be referred to generally as a semiconductor device, and may embodied as a single chip, such as a memory chip or logic chip, or may be part of a stack of various memory chips or logic chips. The semiconductor chip 110 may include a conductive pad 112 exposed with respect to the semiconductor chip 110 at the first surface F1. The various pads of a device described herein may be conductive terminals connected to internal wiring of the device, and may transmit signals and/or supply voltages between an internal wiring and/or internal circuit of the device and an external source. For example, chip pads (e.g., conductive pads 112) of a semiconductor chip (e.g., chip 110) may electrically connect to and/or supply voltages and/or signals between an integrated circuit on the semiconductor chip and a device to which the semiconductor chip is connected. The various pads described herein may be provided on or near an external surface of a device (e.g., semiconductor chip, package substrate, interposer chip, etc.) and may generally have a planar surface area (often larger than a corresponding surface area of the internal wiring to which they are connected) to promote connection to a further terminal, such as a bump or solder ball, and/or an external wiring.

Also, the semiconductor chip 110 may include a first protective layer 114 exposed with respect to the semiconductor chip 110 at the first surface F1 and covering a lateral side of the conductive pad 112. Here, for convenience of description, an upper surface of the first protective layer 114 that is opposite to the second surface F2 of the semiconductor chip 110 is referred to as the first surface F1. The first protective layer 114 may include, for example, a silicon nitride layer, a polyimide layer, or a stacked structure of these layers. For example, the first protective layer 114 may include a double-layered structure of a silicon nitride layer and a polyimide layer. For convenience of description, certain components are only described herein in the singular, though the semiconductor device may include a plurality of such components (e.g., pads, vias, etc.).

The connection via 130, also referred to as a through via, conductive via, or through-molding via, may be laterally spaced apart from the semiconductor chip 110 on at least one side of the semiconductor chip 110. FIG. 1A illustrates that the connection vias 130 are arranged on both sides of the semiconductor chip 110, but the inventive concept is not limited thereto. The connection vias 130 may be arranged in various layouts depending on a kind and a size of the semiconductor chip package 100, a number of I/O terminals included in the semiconductor chip package 100, etc.

As exemplarily illustrated in FIG. 1B, the connection via 130 may have a height greater than the height of the semiconductor chip 110, but the inventive concept is not limited thereto. Unlike FIG. 1B, the connection via 130 may have the same height at that of the semiconductor chip 110.

Here, for convenience of description, one end of the connection via 130 that is close to and corresponds to the first surface F1 of the semiconductor chip 110 is referred to as a bottom portion, and a surface of the connection via 130 that is adjacent to the bottom portion of the connection via 130 is referred to as a bottom surface 130_B of the connection via 130. Also, the other end of the connection via 130 that is close to and corresponds to the second surface F2 of the semiconductor chip 110 and opposite to the bottom portion of the connection via 130 is referred to as an upper portion, and a surface of the connection via 130 that is adjacent to the upper portion of the connection via 130 is referred to as an upper surface 130_U, or top surface, of the connection via 130. As described herein with respect to upper and lower, or top and bottom portions of components, where two components each have a top or upper portion or surface and a bottom or lower portion or surface and the direction from top to bottom for the first component is the same as that of the second component, the top or upper portion or surface of the first component may be described as "corresponding to" the top or upper portion or surface of the second component, and the bottom or lower portion or surface of the first component may be described as "corresponding to" the bottom or lower portion or surface of the second component.

As illustrated in FIG. 1C, the connection via 130 may include a lateral wall 130S inclined with a predetermined slope. The connection via 130 may have a first width W1 along a horizontal direction, and the first width W1 may be reduced at a predetermined rate toward the bottom portion of the connection via 130. The first width W1 of the connection via 130, measured at any vertical location along the via, may be in some embodiments smaller than 190 micrometers, or in some embodiments smaller than 160 micrometers. Using the above methods, in some embodiments, the first width W1 of the connection via 130, measured at any vertical location along the via (e.g., a width measured at the top of the via, or at the bottom of the via) may be, for example about 10 to about 100 micrometers, but is not limited thereto. Thus, in some embodiments, the largest width of the through-molding via along its vertical height may be a width between 10 micrometers and 100 micrometers.

According to an example embodiment, the connection via 130 may have a circular cross-section along a horizontal direction, but the connection via 130 may have various cross-sectional shapes such as an elliptical shape, a quadrangular shape, a rectangular shape, a square shape, a trapezoid shape, and a polygonal shape.

The molding member 140 may surround or cover the lateral wall of the semiconductor chip 110 and the lateral wall of the connection via 130. As exemplarily illustrated in FIGS. 1B and 1C, when the second surface F2 of the semiconductor chip 110 is located on a level lower than the upper surface 130_U of the connection via 130, the molding member 140 may surround the lateral wall and the second surface F2 of the semiconductor chip 110, and also surround the lateral wall 130S of the connection via 130. Meanwhile, unlike FIGS. 1B and 1C, when the second surface F2 of the semiconductor chip 110 is located on a level that is the same as the upper surface 130_U of the connection via 130, the molding member 140 may surround the lateral wall of the semiconductor chip 110 and the lateral wall 130S of the connection via 130, for example without covering the second surface F2 of the semiconductor chip 110.

According to example embodiments, the molding member 140 may include an insulating material such as an epoxy mold compound (EMC) material. In this case, the molding member 140 may include a single material layer. In an exemplary process of forming the molding member 140, the molding member 140 may be formed by injecting a molding material to fill an empty space around the semiconductor chip 110 and a preliminary connection via structure 30 (see FIG. 10B) with the semiconductor chip 110 and a preliminary connection via structure 30 attached on a carrier substrate 210 (see FIG. 10B), and hardening the molding material, and accordingly, the molding member 140 may include a single material layer. The molding member 140 may be generally described as a molding structure, or molding layer.

According to an example embodiment, the upper surface of the molding member 140 may be located on a level that is the same as the upper surface 130_U of the connection via 130. Accordingly, the upper surface of the molding member 140 around the upper surface 130_U of the connection via 130 may form the same plane as and may be coplanar with the upper surface 130_U of the connection via 130. In an exemplary process of forming the connection via 130, a structure including the molding member 140 that surrounds the semiconductor chip 110 and the preliminary connection via structure 30 may be planarized by a grinding process until a support portion 32 (see FIG. 10B) of the preliminary connection via structure 30 is removed, and the connection via 130 may be formed from a connection via portion 34 (see FIG. 10B) of a remaining preliminary connection via structure 30. Accordingly, the upper surface of the molding member 140 may be located on a level that is the same as the upper surface 130_U of the connection via 130.

In an example embodiment, the connection via 130 may be disposed with an adjacent connection via 130 at a fine pitch (or an interval between the connection via 130 and the adjacent connection via 130 may be relatively small). For example, the connection via 130 may have a pitch (or a distance between the center of the connection via 130 and the center of the adjacent connection via 130) ranging from about 30 to about 300 micrometers. However, the inventive concept is not limited thereto. In an exemplary process of forming the connection via 130, the connection via 130 may be formed by using a method of forming the preliminary connection via structure 30 in which a plurality of connection via portions 34 are disposed with a relatively small interval by using a patterning process, and leaving only the connection via portion 34 from among the preliminary connection via structure 30 by using a grinding process. Accordingly, the connection via 130 may be disposed with the adjacent connection via 130 at a relatively small interval.

The redistribution layer 160 may include a redistribution plug 162, a redistribution pattern 164, and a redistribution insulating layer 166. The redistribution plug 162 may contact a conductive pad 112 or the connection via 130. The redistribution pattern 164 may be electrically connected to the conductive pad 112 or the connection via 130 by the redistribution plug 162. FIG. 1B exemplarily illustrates that a connection structure of the redistribution plug 162 and the redistribution pattern 164 is connected to a different connection structure of the redistribution plug 162 and the redistribution pattern 164 located at a level different from that of the above connection structure (for example, FIG. 1B illustrates a structure in which a first redistribution plugs 162 located at a first level is connected to a first redistribution pattern 164 above it, which is connected to a second redistribution plug 162 above that, which is connected to a second redistribution pattern 164 above that). However, the inventive concept is not limited thereto, and the redistribution layer 160 may have a structure in which only one redistribution plug 162 is connected to one redistribution pattern 164 between an under-bump metal layer 172 and a connection via 130 or conductive pad 112 (each being described further below). Unlike this, the redistribution layer 160 may have a structure in which three or more redistribution plugs 162 are connected to three or more redistribution patterns 164 on different levels. The redistribution insulating layer 166 may surround the redistribution plug 162 and the redistribution pattern 164. Though not shown, the redistribution insulating layer 166 may include a plurality of insulating layers, and different ones of the plurality of insulating layers may have an upper surface located on a level that is the same as respective levels of the upper surfaces of the redistribution plug 162 and the redistribution pattern 164.

In exemplary embodiments, the redistribution plug 162 and the redistribution pattern 164 may be formed of a conductive material, for example, a metal, and may include at least one of Cu, Al, W, Ni, Ti, TiN, Ta, TaN, and Au. The redistribution layer 160 may form the package substrate of the package 100, and may also be referred to as a package base layer.

An under bump metal (UBM) layer 172 may be connected to the redistribution plug 162 or the redistribution pattern 164, and may be exposed outside the redistribution insulating layer 166. The UBM layer 172 may include a conductive material such as, for example, a metal, and may include Cr, W, Ti, Cu, Ni, Al, Pd, Au, or a combination of these.

A connection terminal 174 for connection with an external device may be disposed on the UBM layer 172. The connection terminal 174 may be a solder ball or a conductive bump, for example.

As exemplarily illustrated in FIG. 1C, a bottom surface 130_B of the connection via 130 may have a lower surface level LV2 lower than a level LV1 of the bottom surface of the molding member 140. Thus, a bottom portion of the connection via 130, including a bottom surface of the connection via 130, may extend to a level below, or beyond, the bottom surface of the molding member 140. Accordingly, a lower side of the lateral wall 130S of the connection via 130 may be surrounded by the redistribution insulating layer 166. In an exemplary process of forming the connection via 130, after the preliminary connection via structure 30 is temporarily fixed on a first adhesive member 220 (see FIG. 10B) disposed on a first carrier substrate 210, the molding member 140 surrounding the preliminary connection via structure 30 may be formed. In this case, the first adhesive member 220 may include a polymer material having a relatively low hardness. Therefore, during a temporary fixing process of the preliminary connection via structure 30, a portion of the first adhesive member 220 that corresponds to the lower portion of the preliminary connection via structure 30 receive pressing force and the bottom surface of the preliminary connection via structure 30 (for example, the bottom surface of the connection via portion 34) may be located at a level lower than the upper surface of the first adhesive member 220. Selectively, to secure a sufficient contact area between the preliminary connection via structure 30 and the redistribution plug 162, after the preliminary connection via structure 30 is placed on the first adhesive member 220, a predetermined pressure may be applied to the preliminary connection via structure 30. Accordingly, the bottom surface 130_B of the connection via 130 may have the lower surface level LV2 lower than the level LV1 of the bottom surface of the molding member 140, and thus a sufficient contact area between the bottom surface 130_B of the connection via 130 and the redistribution plug 162 connected thereto may be secured.

As exemplarily illustrated in FIG. 1C, the first surface F1 of the semiconductor chip 110 may have a lower surface level LV3 lower than the level LV1 of the bottom surface of the molding member 140. Accordingly, a lower side of the lateral wall of the semiconductor chip 110 may be surrounded by the redistribution insulating layer 166. FIG. 1C exemplarily illustrates that not only the first surface F1 of the semiconductor chip 110 (that is, the bottom surface of the first protective layer 114) but also the upper surface of the first protective layer 114 are located at a level lower than the level LV1 of the bottom surface of the molding member 140. However, the inventive concept is not limited thereto, and the upper surface of the first protective layer 114 may be located at a level that is the same as or higher than the level LV1 of the bottom surface of the molding member 140.

FIG. 1C has exaggerated a difference between the lower surface levels LV1, LV2, and LV3 in order to exemplarily show relative locations of the molding member 140, the connection via 130, and the semiconductor chip 110. Therefore, unlike FIG. 1C, the relative differences of the lower surface levels LV1, LV2, and LV3 may change. In some embodiments, a level difference between LV1 and LV2 may be smaller than 10% or 5% of the total height of the connection via 130 (or smaller than 20% in some cases).

The semiconductor chip package 100 may be manufactured by mounting the preliminary connection via structure 30 formed in advance such that the preliminary connection via structure 30 is spaced apart from the semiconductor chip 110, and forming the molding member 140 surrounding the preliminary connection via structure 30 and the semiconductor chip 110. Therefore, the connection via 130 formed from the preliminary connection via structure 30 that may implement a fine pitch may have a fine pitch. Also, since the bottom surface 130_B of the connection via 130 has the level LV2 lower than the lower level LV1 of the molding member 140, a sufficient contact area between the connection via 130 and the redistribution plug 162 may be secured. Therefore, the semiconductor chip package 100 may have excellent reliability.

Figure 2A:
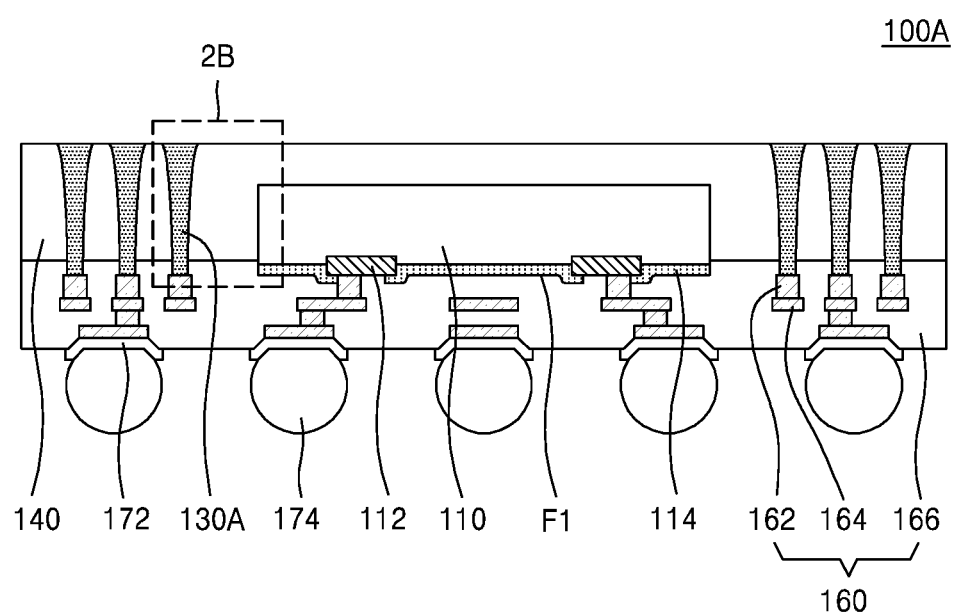
FIG. 2A is a cross-sectional view illustrating a semiconductor chip package according to an example embodiment.
Figure 2B:
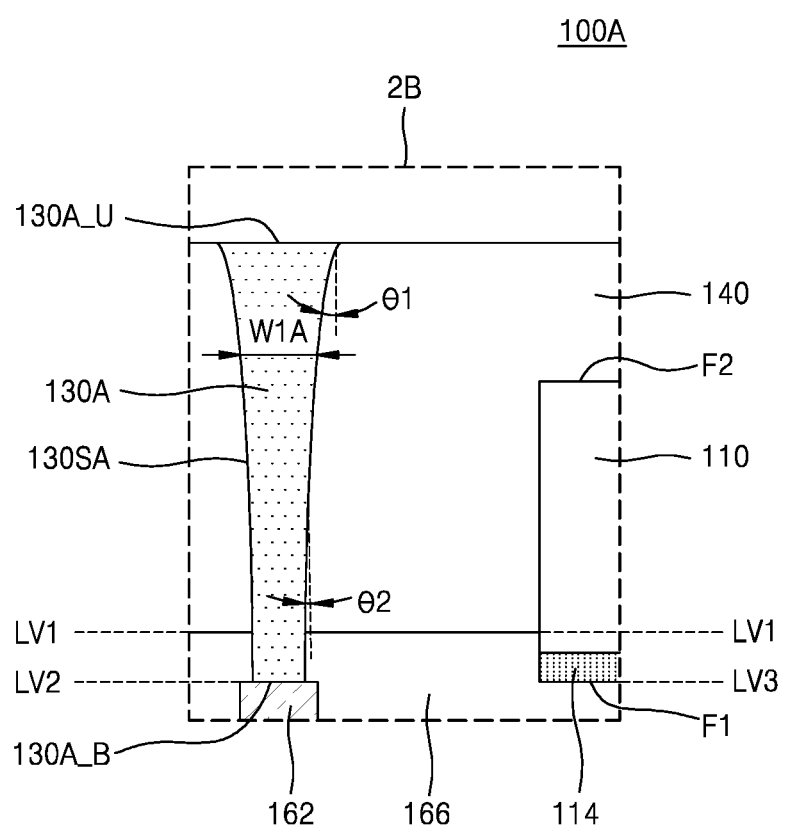
FIG. 2B is an enlarged view of a portion 2B of FIG. 2A, according to an example embodiment.

FIG. 2A is a cross-sectional view illustrating a semiconductor chip package 100A according to an example embodiment, and FIG. 2B is an enlarged view of a portion 2B of FIG. 2A. Since the semiconductor chip package 100A according to FIGS. 2A and 2B is similar to the semiconductor chip package 100 described with reference to FIGS. 1A to 1C except the shape of a connection via 130A, differences are mainly described. Reference numerals in FIGS. 2A and 2B that are the same as those in FIGS. 1A to 1C denote the same components.

Referring to FIGS. 2A and 2B, the connection via 130A has a first width W1A, and the width W1A may be gradually reduced toward a bottom surface 130A_B from an upper surface 130A_U. A lateral wall 130SA of the connection via 130A may be inclined with respect to a direction perpendicular to the first surface F1 of the semiconductor chip 110. A first inclination angle θ1 at an upper portion of the connection via 130A that is adjacent to the upper surface 130A_U of the connection via 130A may be greater than a second inclination angle θ2 at a bottom portion of the connection via 130A that is adjacent to the bottom surface 130A_B of the connection via 130A. For example, the first inclination angle θ1 may be in a range from about 2 to about 30°, and the second inclination angle θ2 may be in a range from about 2 to about 10°, but the first inclination angle θ1 and the second inclination angle θ2 are not limited thereto. As a result of the different angles, the connection via 130A may have a horn shape.

Figure 7A:
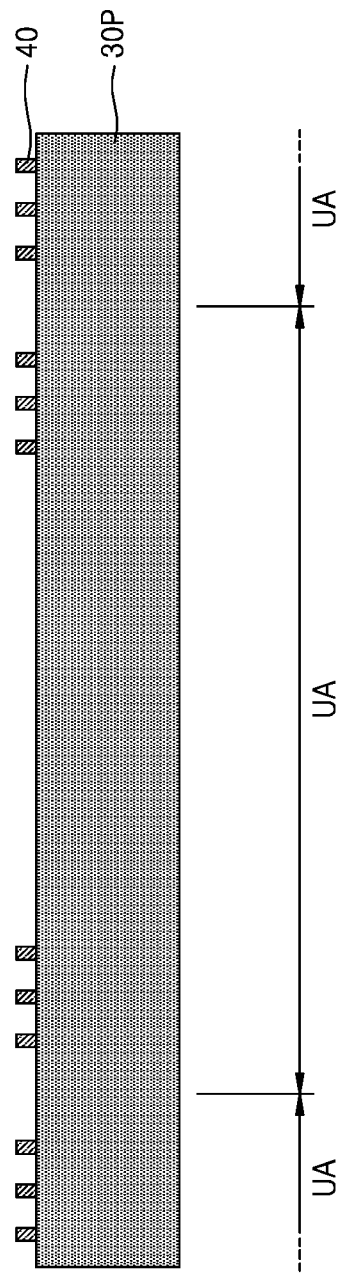
FIGS. 7A to 7C are cross-sectional views and a plan view illustrating a method of manufacturing a preliminary connection via structure according to an example embodiment.

In an exemplary process of forming the connection via 130A, the preliminary connection via structure 30 (see FIG. 7D) including the support portion 32 (see FIG. 7D) and the connection via portion 34 (see FIG. 7D) may be formed by patterning a metallic plate 30P (see FIG. 7A). When an etching location moves downward from the upper surface of the metallic plate 30P (for example, when the etching location is close to a boundary surface between the support portion 32 and the connection via portion 34) in the patterning process, an amount of etching the metallic plate 30P may be reduced, and the connection via portion 34 may have an inclined lateral wall. A profile of the lateral wall of the connection via 34 may change depending on a kind of the metallic plate 30P, a kind of an etching process, a kind of an etchant, an interval between the connection via portions 34, etc. Particularly, the connection via portion 34 may have a lateral wall having a predetermined slope as illustrated in FIG. 7D, and unlike this, the connection via portion 34 may have a lateral wall having an inclination angle that changes depending on a vertical location (for example, having an irregular inclination angle).

Figure 3A:
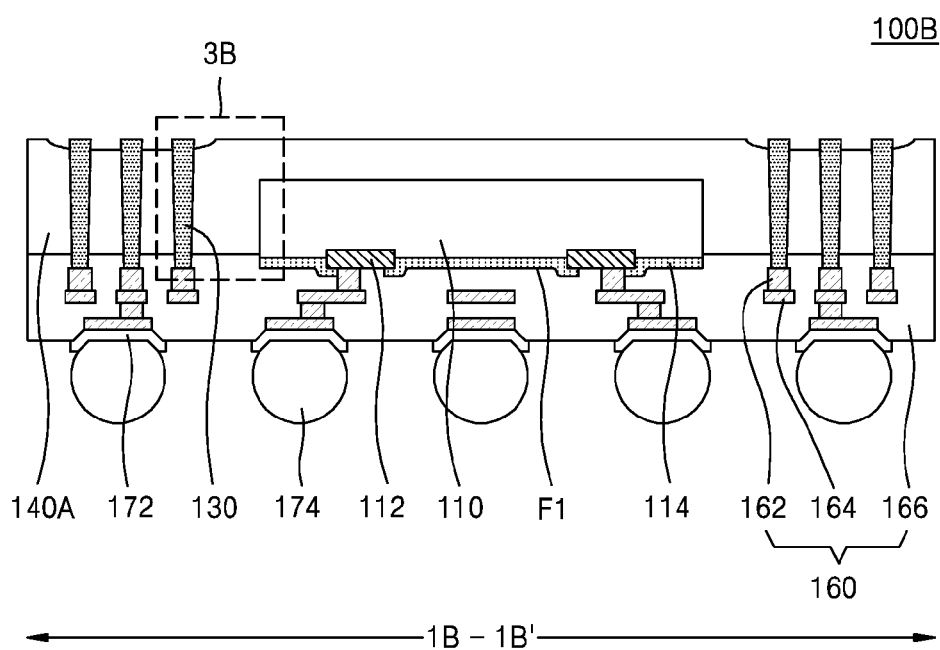
FIG. 3A is a cross-sectional view illustrating a semiconductor chip package according to an example embodiment.
Figure 3B:
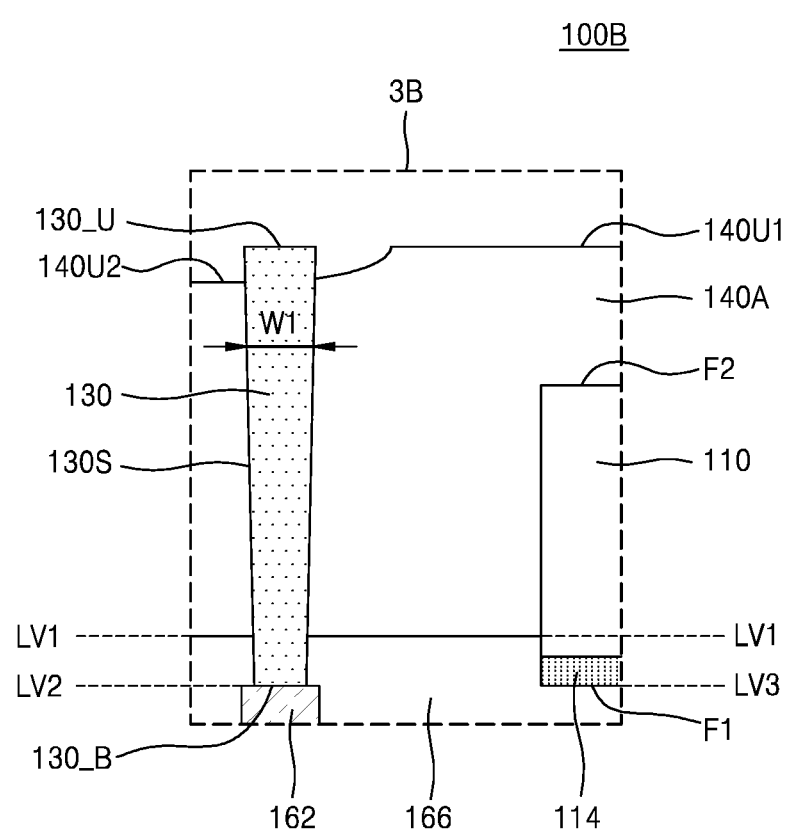
FIG. 3B is an enlarged view of a portion 3B of FIG. 3A, according to an example embodiment.

FIG. 3A is a cross-sectional view illustrating a semiconductor chip package 100B according to an example embodiment, and FIG. 3B is an enlarged view of a portion 3B of FIG. 3A. Reference numerals in FIGS. 3A and 3B that are the same as those in FIGS. 1A and 1B denote the same components.

Referring to FIGS. 3A and 3B, a molding member 140A may have a first upper surface 140U1 and a second upper surface 140U2. The first upper surface 140U1 of the molding member 140A may vertically overlap the semiconductor chip 110, and may be located on the same level as the upper surface 130_U of the connection via 130. The second upper surface 140U2 of the molding member 140A may be located at a region where the connection via 130 is located, for example it may be located in the vicinity of the connection via 130, and may surround the lateral wall 130S of the connection via 130. The second upper surface 140U2 of the molding member 140A may be located at a level lower than the upper surface 130_U of the connection via 130. Accordingly, an upper portion of the connection via 130 may protrude upward from, or may extend beyond the second upper surface 140U2 of the molding member 140A.

In an exemplary process of forming the connection via 130, the connection via 130 having the upper surface 130_U that is located on the same level as the molding member 140A may be formed by forming the molding member 140A surrounding the preliminary connection via structure 30 (see FIG. 10B) and the vicinity of the semiconductor chip 110, and removing an upper portion of the preliminary connection via structure 30. After that, the upper portion of the connection via 130 may protrude upward from the second upper surface 140U2 of the molding member 140A by removing a portion of the molding member 140A that corresponding to the vicinity of the connection via 130 by using a laser irradiation process, etc.

As illustrated in FIG. 3B, since the upper portion of the connection via 130 protrudes upward from the second upper surface 140U2 of the molding member 140A, a surface area of the connection via 130 that is exposed outside the molding member 140A may increase. Therefore, when another semiconductor chip package (not shown) is stacked above the semiconductor chip package 100B, stable electrical connection may be provided between the connection via 130 and a connection terminal (not shown) of the other semiconductor chip package. Also, when the other semiconductor chip package is stacked above the semiconductor chip package 100B, misalignment between the connection via 130 and the connection terminal (for example, a solder ball) of the other semiconductor chip package may be reduced or prevented.

The connection via 130 illustrated in FIGS. 3A and 3B may be replaced by the connection via 130A described with reference to FIGS. 2A and 2B. It should be noted that the various connection vias (e.g., 130 or 130A) described herein may be formed of a conductive material, such as a metal.

Figure 4:
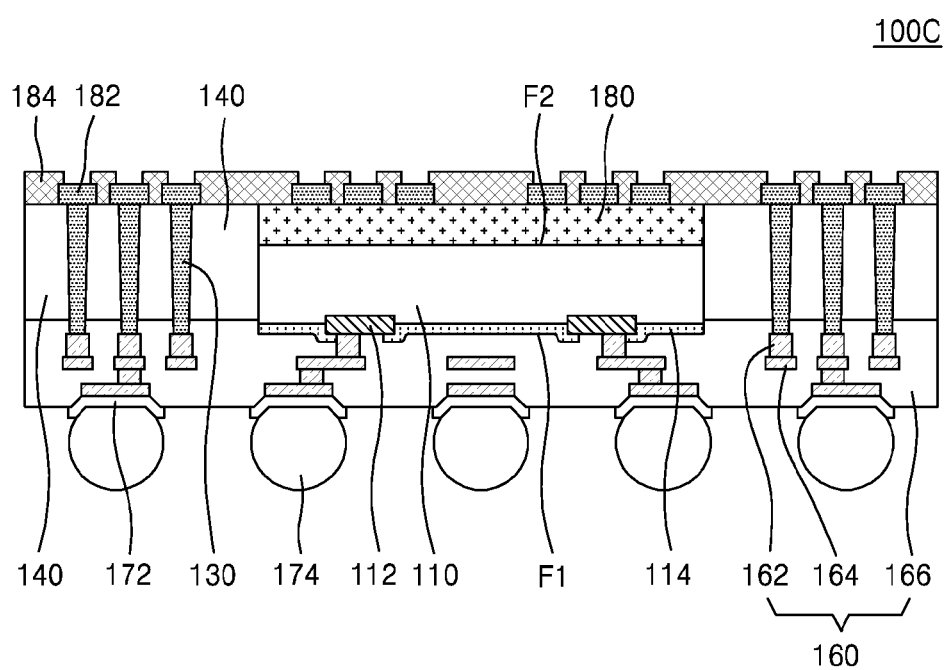
FIG. 4 is a cross-sectional view illustrating a semiconductor chip package according to an example embodiment.

FIG. 4 is a cross-sectional view illustrating a semiconductor chip package 100C according to an example embodiment. In FIG. 4, reference numerals that are the same as those in FIGS. 1A to 3B denote the same components.

Referring to FIG. 4, a second protective layer 180 may be formed on the semiconductor chip 110. The second protective layer 180 may include an insulating material such as polyimide and an epoxy resin. Also, the second protective layer 180 may be a die attach film (DAF).

A wiring pattern 182 may be disposed on the connection via 130 and/or the second protective layer 180. The wiring pattern 182 that is connected to the connection via 130 may be integrally formed with the connection via 130. The wiring pattern 182 that is disposed at a location vertically overlapping the semiconductor chip 110 may not be electrically connected to the second surface F2 of the semiconductor chip 110 due to the second protective layer 180 disposed therebetween. A third protective layer 184 exposing the upper surface of the wiring pattern 182 may be disposed on the molding member 140.

In an exemplary process of forming the connection via 130, the preliminary connection via structure 30 including the support portion 32 and the connection via portion 34 may be disposed in the vicinity of the semiconductor chip 110, and the molding member 140 surrounding the preliminary connection via structure 30 and the semiconductor chip 110 may be formed. After that, the wiring pattern 182 may be formed by leaving the support portion 32 by a predetermined height during a grinding process of removing the upper surface of the molding member 140, and then patterning the support portion 32. When another semiconductor chip package (not shown) is stacked above the semiconductor chip package 100C, a layout of the wiring pattern 182 may change depending on the arrangement or pitch of a connection terminal (not shown) of the other semiconductor chip package. Therefore, since a semiconductor chip package stack may be formed even in the case where the pitch of the connection terminal of the other semiconductor chip package is different from the pitch of the connection via 130, the semiconductor chip package 100C may have improved flexibility.

Figure 5:
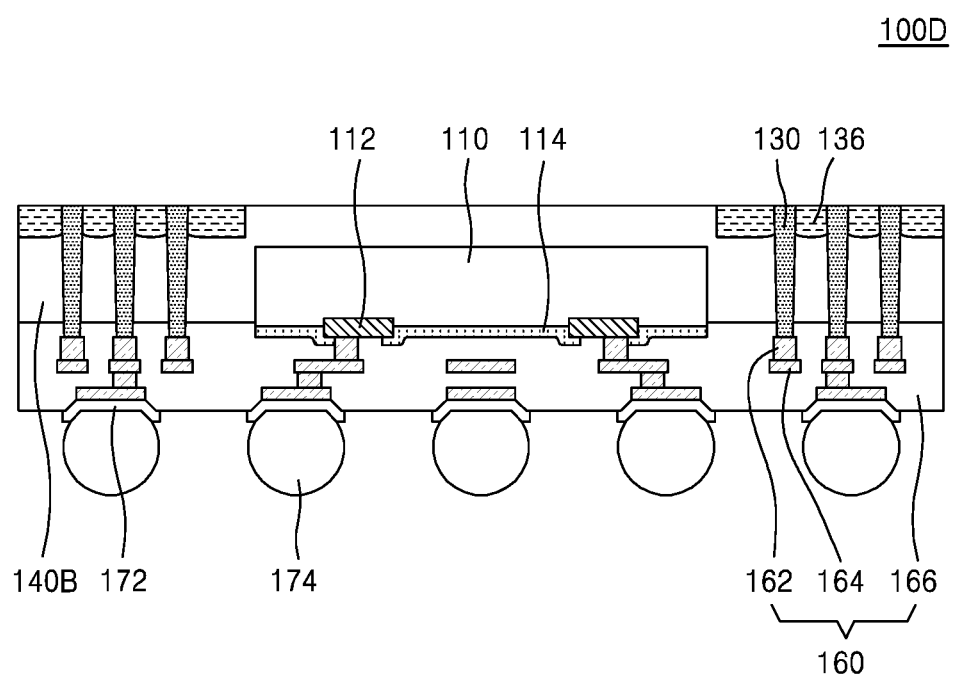
FIG. 5 is a cross-sectional view illustrating a semiconductor chip package according to an example embodiment.

FIG. 5 is a cross-sectional view illustrating a semiconductor chip package 100D according to an example embodiment. In FIG. 5, reference numerals that are the same as those in FIGS. 1A to 4 denote the same components.

Referring to FIG. 5, an upper portion of the lateral wall of the connection via 130 may be surrounded by a support insulating layer 136. The upper surface of the support insulating layer 136 may be located at the same level as the upper surface of the connection via 130, but the inventive concept is not limited thereto. The support insulating layer 136 may surround the vicinity of the lateral wall of the connection via 130 between adjacent connection vias 130, and may not be disposed at a location that vertically overlaps the semiconductor chip 110. The support insulating layer 136 may have a height (or a thickness) ranging from about 10 to about 50% of the height of the connection via 130, but the height of the support insulating layer 136 is not limited thereto. According to an example embodiment, the support insulating layer 136 may include an insulating material such as an EMC or an epoxy resin, but the material of the support insulating layer 136 is not limited thereto.

A molding member 140B may surround the lateral wall and the upper surface of the semiconductor chip 110, the lateral wall of the connection via 130, and the lateral wall and the bottom surface of the support insulating layer 136. An upper surface (e.g., upper-most surface) of the molding member 140B may be located on the same level as an upper surface (e.g., upper-most surface) of the support insulating layer 136.

In an exemplary process of forming the connection via 130, a preliminary connection via structure 30A (see FIG. 8B) including the support portion 32 (see FIG. 8B), the connection via portion 34, and the support insulating layer 36 (see FIG. 8B) may be disposed in the vicinity of the semiconductor chip 110, and the molding member 140 surrounding the preliminary connection via structure 30A and the semiconductor chip 110 may be formed. The support insulating layer 36 may serve as an auxiliary support member preventing the preliminary connection via structure 30A from being misaligned or falling down during a process of molding the preliminary connection via structure 30A. Therefore, even when the height of the support portion 32 is relatively small, the preliminary connection via structure 30A may be sufficiently supported by the support insulating layer 36, and thus a time consumed for a grinding process of removing the support portion 32 may be reduced.

Figure 6:
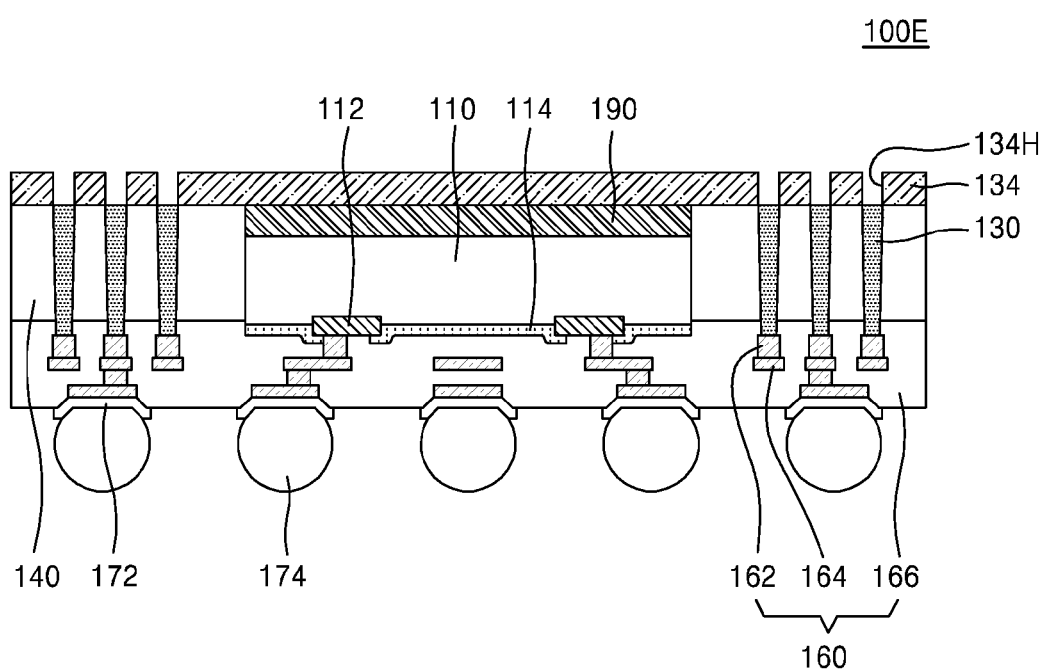
FIG. 6 is a cross-sectional view illustrating a semiconductor chip package according to an example embodiment.

FIG. 6 is a cross-sectional view illustrating a semiconductor chip package 100E according to an example embodiment. In FIG. 6, reference numerals that are the same as those in FIGS. 1A to 5 denote the same components.

Referring to FIG. 6, the second surface F2 of the semiconductor chip 110 may be attached to an insulating frame 134 by using a die attach film (DAF) 190. The insulating frame 134 may include openings 134H, and each connection via 130 may be exposed outside the semiconductor chip package 100E via each opening 134H. According to an example embodiment, the insulating frame 134 may include at least one of a phenolic resin, an epoxy resin, and polyimide.

The molding member 140 may surround the lateral side of the semiconductor chip 110 and the lateral wall of the connection via 130, and the upper surface of the molding member 140 may contact the insulating frame 134.

In an exemplary process of forming the connection via 130, a preliminary connection via structure 30B (see FIG. 9B) including an insulating support portion 32A (see FIG. 9B) including an insulating material, and the connection via portion 34 (see FIG. 9B) attached on the insulating support portion 32A may be formed, the preliminary connection via structure 30B is located so that the insulating support portion 32A of the preliminary connection via structure 30B may be disposed on the semiconductor chip 110, and then the molding member 140 surrounding the preliminary connection via structure 30B and the semiconductor chip 110 may be formed. In this case, the insulating support portion 32A including the insulating material may correspond to the insulating frame 134, and the upper surface of the connection via 130 may be exposed by forming the opening 134H in the insulating frame 134 by using a patterning process.

According to the semiconductor chip package 100E, the insulating support portion 32A included inside the preliminary connection via structure 30B may not be removed by a grinding process and may be used as a frame in which the semiconductor chip 110 is mounted. Therefore, the structural stability of the semiconductor chip package 100E may improve.

Figure 7B:
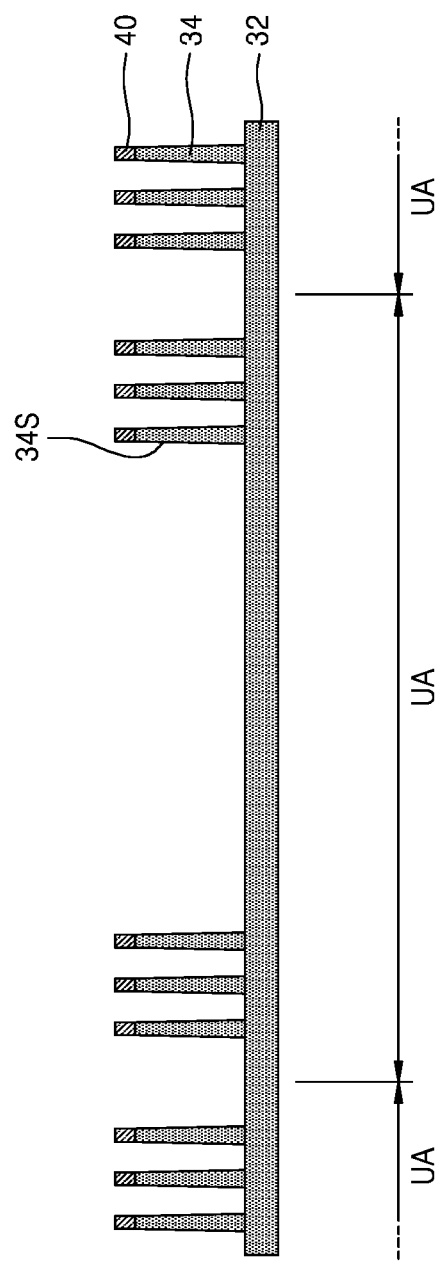
Figure 7C:
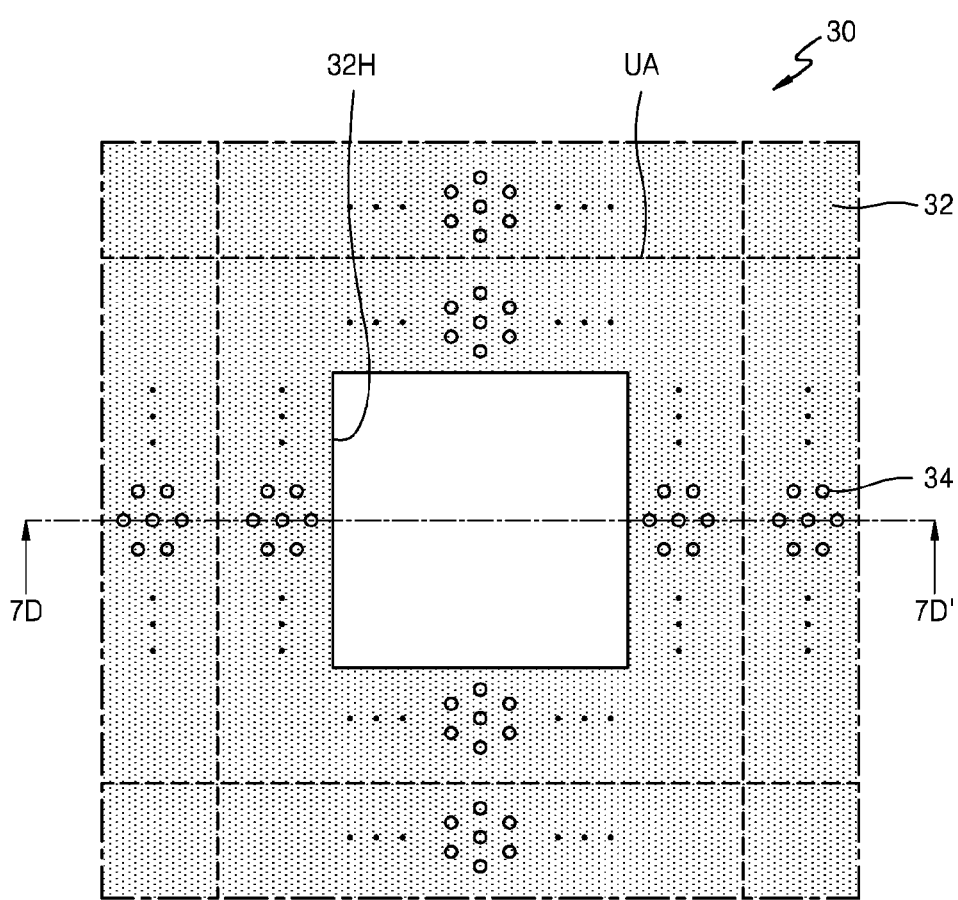
Figure 7D:
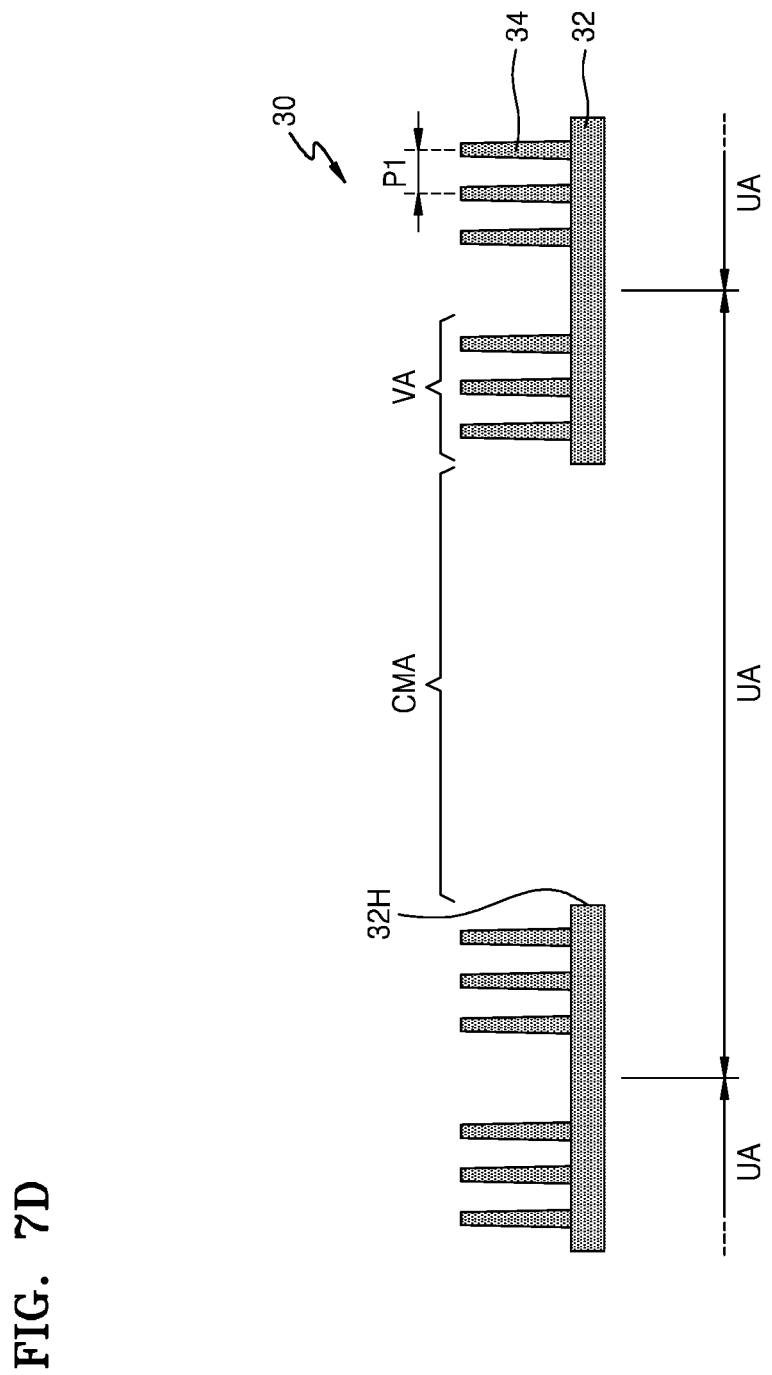
FIG. 7D is a cross-sectional view taken along a line 7D-7D' of FIG. 7C according to an example embodiment.

FIGS. 7A to 7C are cross-sectional views and a plan view illustrating a method of manufacturing a preliminary connection via structure 30 according to an example embodiment, and FIG. 7D is a cross-sectional view taken along a line 7D-7D' of FIG. 7C.

Referring to FIG. 7A, the metallic plate 30P including a plurality of unit areas UA may be provided. The metallic plate 30P may include Cu, Al, Ti, Ni, Au, or a combination of these. For example, the metallic plate 30P may be a Cu foil having a predetermined thickness, but is not limited thereto. Though not shown in FIG. 7A, a support substrate (not shown) may be provided, and the metallic plate 30P may be disposed on the support substrate.

A first mask pattern 40 may be formed on the metallic plate 30P. The first mask pattern 40 may be disposed at a location corresponding to a location at which the connection via portion 34 (see FIG. 7B) is formed.

According to an example embodiment, the first mask pattern 40 may be a photoresist pattern.

Referring to FIG. 7B, the connection via portion 34 and the support portion 32 connected to the connection via portion 34 may be formed by etching the upper portion of the metallic plate 30P (see FIG. 7A) to a predetermined height by using the first mask pattern 40 as an etching mask.

According to an example embodiment, the width of connection vias of the connection via portion 34 may be about 10 to about 100 micrometers, but is not limited thereto. The height of the connection via portion 34 may be about 50 to about 200 micrometers, but is not limited thereto. The width and the height of the connection via portion 34 may be appropriately selected by taking into account the height of the support portion 32, the height of the semiconductor chip, the height of the semiconductor chip package, etc. According to certain embodiments, the height of the connection via portion 34 is the same as or greater than the height of the semiconductor chip. When the height of the connection via portion 34 is too high, a long time may be consumed for a grinding process of removing the support portion 32 after a molding process.

As an etching location is moved downward from the upper surface of the metallic plate 30P, the already formed lateral wall 34S of the connection via portion 34 may be exposed to an etching atmosphere, and thus the lateral wall 34S of the connection via portion 34 may be further etched. As a result, the lateral wall 34S of the connection via portion 34 may be inclined by a predetermined inclination angle, and thus the width of the bottom portion of the connection via portion 34 may be greater than the width of the upper portion of the connection via portion 34. Though FIG. 7B exemplarily illustrates that the lateral wall 34S of the connection via portion 34 is inclined by a predetermined inclination angle, a connection via portion including a lateral wall having a different inclination angle depending on a vertical location as in the lateral wall 130SA of the connection via 130A illustrated in FIGS. 2A and 2B may be formed.

Based on the above process, the support portion 32 and the connection via portions 34 form a single, continuous, integrally-formed structure. According to an example embodiment, the height of the support portion 32 may be about 10 to about 100 micrometers, but it is not limited thereto. The height of the support portion 32 may be appropriately selected by taking into account the height of the connection via portion 34, the height of the semiconductor chip, the height of the semiconductor chip package, etc. When the height of the support portion 32 is too low, since it is difficult to sufficiently support the connection via portion 34 when the preliminary connection via structure 30 is fixed for a molding process, the preliminary connection via structure 30 may be misaligned or may fall down during the molding process. When the height of the support portion 32 is too high, a long time may be consumed for a grinding process of removing the support portion 32 after the molding process.

Referring to FIGS. 7C and 7D, the preliminary connection via structure 30 may be manufactured by removing a portion of the support portion 32 that corresponds to a semiconductor mounting area CMA inside each unit area UA. The support portion 32 may include an opening 32H in a location corresponding to the semiconductor mounting area CMA, and the rest of the support portion 32 that excludes the semiconductor mounting area CMA may be a via area VA above which the connection via portion 34 is disposed.

According to an example embodiment, the connection via portion 34 may have a first pitch P1 ranging from about 30 to about 300 micrometers (that is, a distance between the center of the connection via portion 34 and the center of the adjacent connection via portion 34, or sum of the width of the connection via portion 34 and an interval between the adjacent connection via portions 34). However, the pitch of the connection via portion 34 is not limited thereto. Since the connection via portion 34 is formed by using an etching process that uses the first mask pattern 40 including a photoresist pattern, the connection via portion 34 may be formed to have a relatively small pitch.

In the case where a conductive via is formed by forming a molding member first, forming a via hole that passes through the molding member by using a process such as a laser drilling, etc., and filling the via hole with a conductive material, the via hole is formed to have a relatively large pitch. It is difficult to form the via hole passing through the molding member so that the via hole may have a small width or form the via holes so that the via holes may be disposed with a small interval, and accordingly, the conductive via filling the via hole has a relatively large pitch. Therefore, it may be difficult to apply the conductive via to a semiconductor chip package including a fine pitch-semiconductor chip, or a fan-out type wafer level package having a compact size.

However, the preliminary connection via structure 30 described with reference to FIGS. 7A to 7D may include the connection via portion 34 having a relatively small pitch formed by using a method of etching the metallic plate 30P. A semiconductor chip package including a fine pitch-semiconductor chip, or a fan-out type wafer level package having a compact size may be implemented by forming a semiconductor chip package in a manner of surrounding the preliminary connection via structure 30 with the molding member.

Figure 8A:
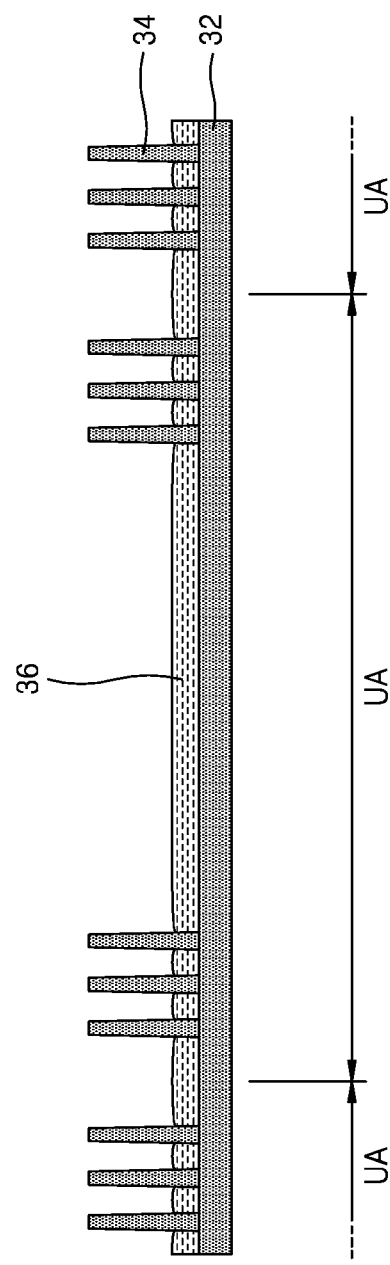
FIGS. 8A and 8B are cross-sectional views illustrating a method of manufacturing a preliminary connection via structure according to an example embodiment.
Figure 8B:
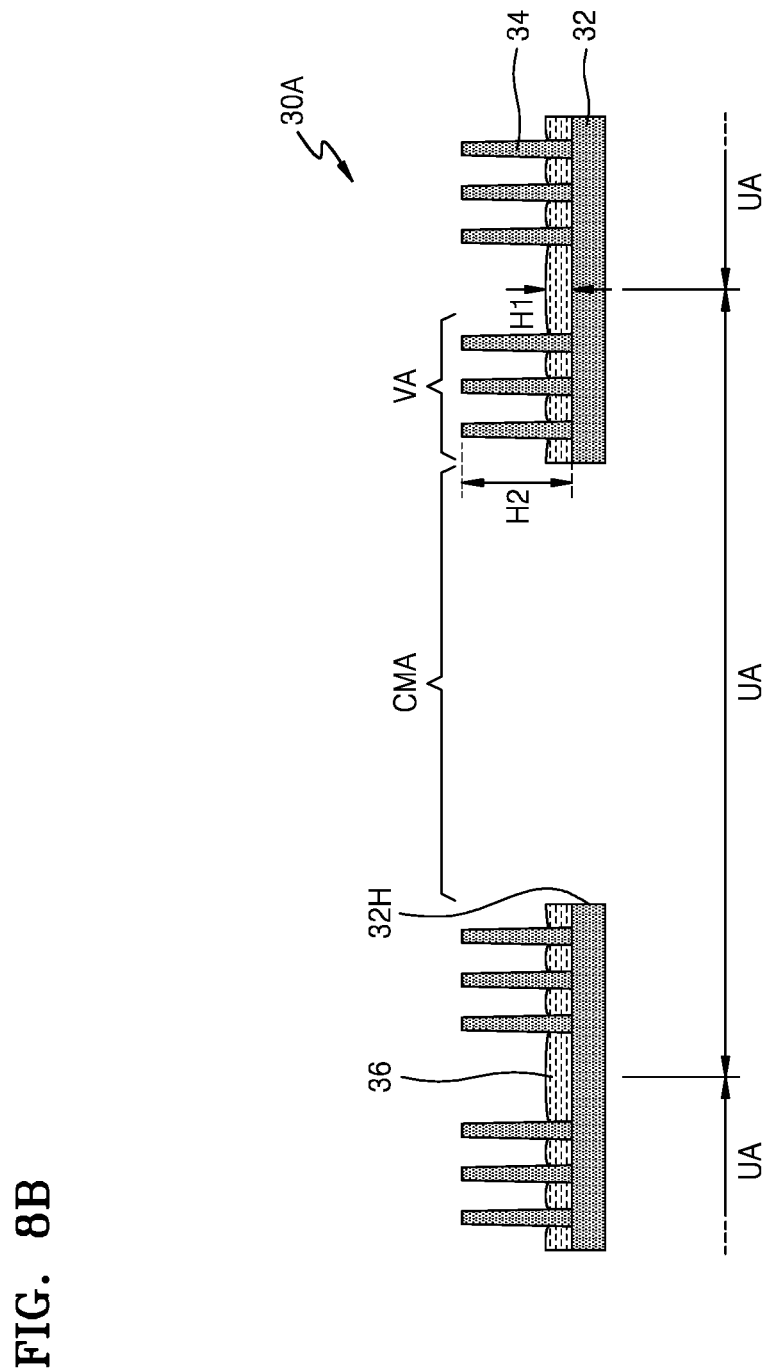

FIGS. 8A and 8B are cross-sectional views illustrating a method of manufacturing a preliminary connection via structure 30A according to an example embodiment. In FIGS. 8A and 8B, reference numerals that are the same as those in FIGS. 7A to 7D denote the same components. The preliminary connection via structure 30A described with reference to FIGS. 8A and 8B may be used for the process of manufacturing the semiconductor chip package 100D described with reference to FIG. 5, but the inventive concept is not limited thereto.

First, a structure including the support portion 32 and the connection via portion 34 is formed by performing the processes described with reference to FIGS. 7A and 7B.

Referring to FIG. 8A, the support insulating layer 36 filling a space between a lower portion of the lateral wall 34S of the connection via portion 34 and the support portion 32 is formed. The support insulating layer 36 may include an insulating material such as an EMC or an epoxy resin, but is not limited thereto.

Referring to FIG. 8B, the preliminary connection via structure 30A may be manufactured by removing a portion of the support portion 32 and a portion of the support insulating layer 36 that correspond to the semiconductor mounting area CMA inside each unit area UA.

In the preliminary connection via structure 30A described with reference to FIGS. 8A and 8B, a first height H1 of the support insulating layer 36 may be about 10% to about 50% of a second height H2 of the lateral wall 34S of the connection via portion 34, but it is not limited thereto. The height of the support insulating layer 36 may be greater than or less than the height of the support portion 32 (or the thickness of the support portion 32 along an extension direction of the connection via portion 34). The height of the support insulating layer 36 may be determined as an appropriate value depending on a relative ratio of the height of the support portion 32 to the height of the connection via portion 34, the pitch and/or the width of the connection via portion 34. The support insulating layer 36 may serve as an auxiliary support member preventing the preliminary connection via structure 30A from being misaligned or falling down during a process of molding the preliminary connection via structure 30A. Therefore, even when the height of the support portion 32 is relatively small, the preliminary connection via structure 30A may be sufficiently supported by the support insulating layer 36, and thus a time consumed for a grinding process of removing the support portion 32 may be reduced.

Figure 9A:
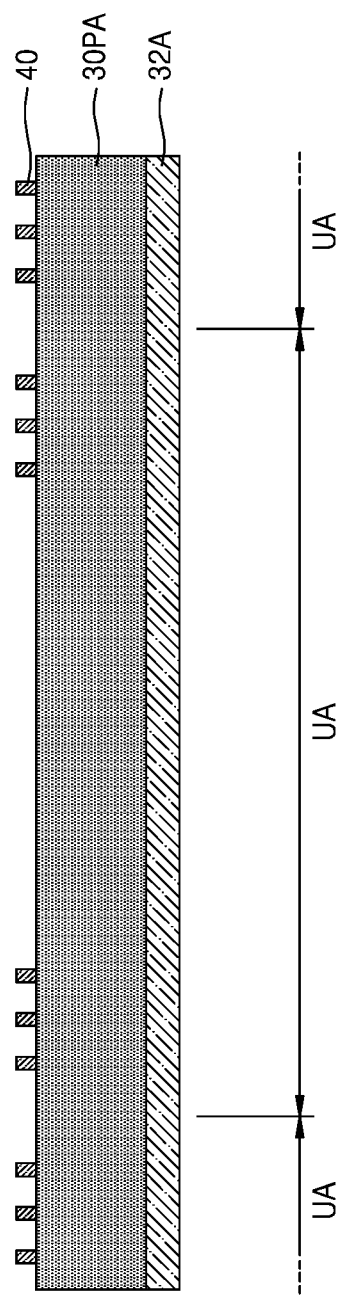
FIGS. 9A and 9B are cross-sectional views illustrating a method of manufacturing a preliminary connection via structure according to an example embodiment.
Figure 9B:
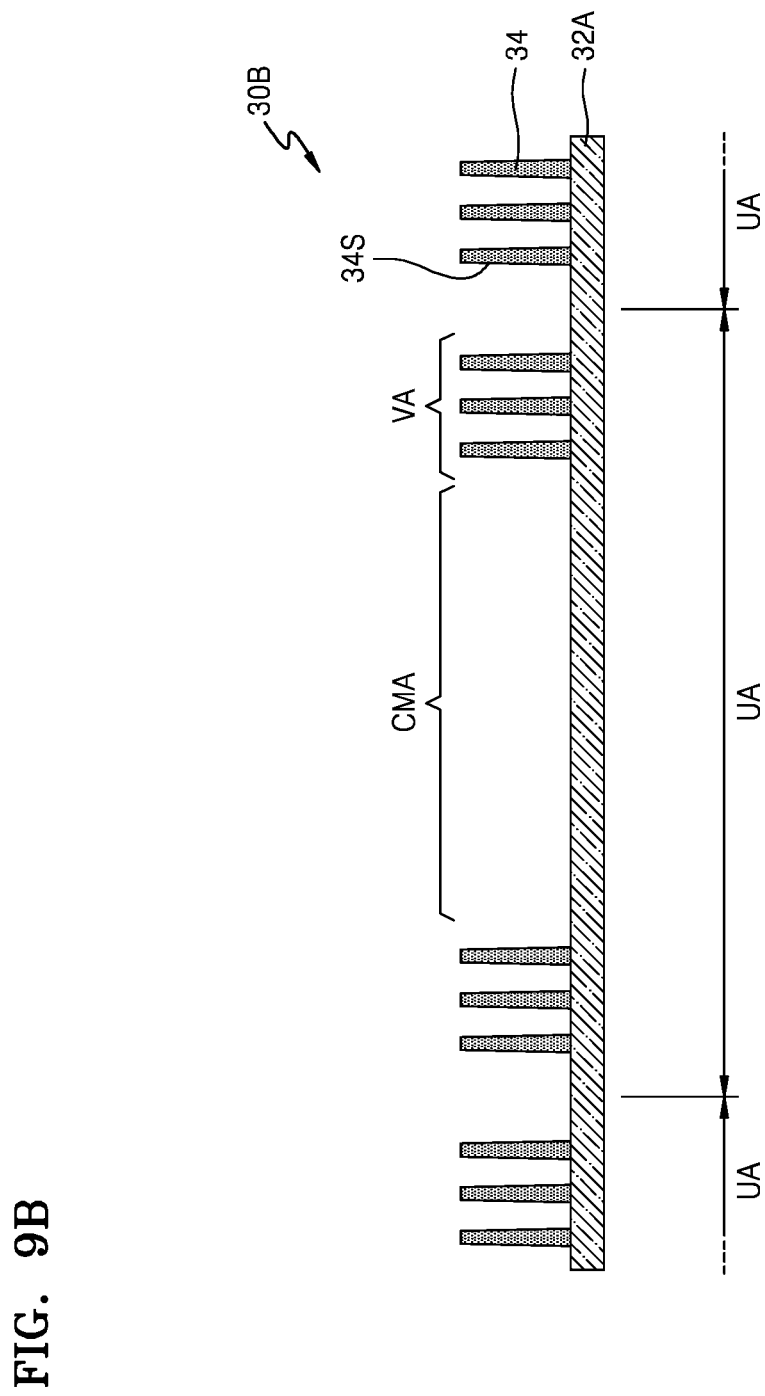

FIGS. 9A and 9B are cross-sectional views illustrating a method of manufacturing a preliminary connection via structure 30B according to an example embodiment. In FIGS. 9A and 9B, reference numerals that are the same as those in FIGS. 7A to 8B denote the same components. The preliminary connection via structure 30B described with reference to FIGS. 9A and 9B may be used for the process of manufacturing the semiconductor chip package 100E described with reference to FIG. 6, but the inventive concept is not limited thereto.

Referring to FIG. 9A, a stacked structure of an insulating support portion 32A and the metallic plate 30PA may be provided.

The insulating support portion 32A may include at least one of a phenolic resin, an epoxy resin, and polyimide. For example, the insulating support portion 32A may include at least one of a bismaleimide triazine (BT) resin, a frame retardant 4 (FR4), polyimide, polyester, tetrafunctional epoxy, polyphenylene ether, epoxy/polyphenylene oxide, thermount, cyanate ester, and liquid crystal polymer.

The metallic plate 30PA may be attached on the insulating support portion 32A by using an adhesive member (not shown). In one embodiment, however, the insulating support portion 32A includes a semi-hardening insulating material having low viscosity, the semi-hardening insulating material and the metallic plate 30PA are allowed to contact each other, and then the semi-hardening insulating material is hardened by heat treatment, etc., so that the stacked structure of the insulating support portion 32A and the metallic plate 30PA may be formed.

The first mask pattern 40 may be formed on the upper surface of the metallic plate 30PA. The first mask pattern 40 may be a photoresist pattern.

Referring to FIG. 9B, the connection via portion 34 may be formed by etching the upper portion of the metallic plate 30P (see FIG. 9A) to a predetermined height by using the first mask pattern 40 (see FIG. 9A) as an etching mask. The upper surface of the insulating support portion 32A may be exposed during the etching process, and the connection via portion 34 may be spaced apart from the adjacent connection via portion 34 on the insulating support portion 32A.

FIG. 9B exemplarily illustrates the connection via portion 34 having the lateral wall 34S inclined by a predetermined inclination angle, but unlike this, the connection via portion 34 including a lateral wall having an inclination angle that changes depending on a vertical position as described with reference to FIG. 2B may be formed.

The preliminary connection via structure 30B illustrated in FIG. 9B may include the insulating support portion 32A and the connection via portion 34 disposed on the insulating support portion 32A. Unlike the description made with reference to FIG. 7D, a portion of the insulating support portion 32A that corresponds to the semiconductor mounting area CMA is not removed, and a semiconductor chip (not shown) may be mounted on the portion of the insulating support portion 32A that corresponds to the semiconductor mounting area CMA.

FIGS. 10A to 10G are cross-sectional views illustrating a method of manufacturing a semiconductor chip package 100 according to an example embodiment.

Figure 10A:
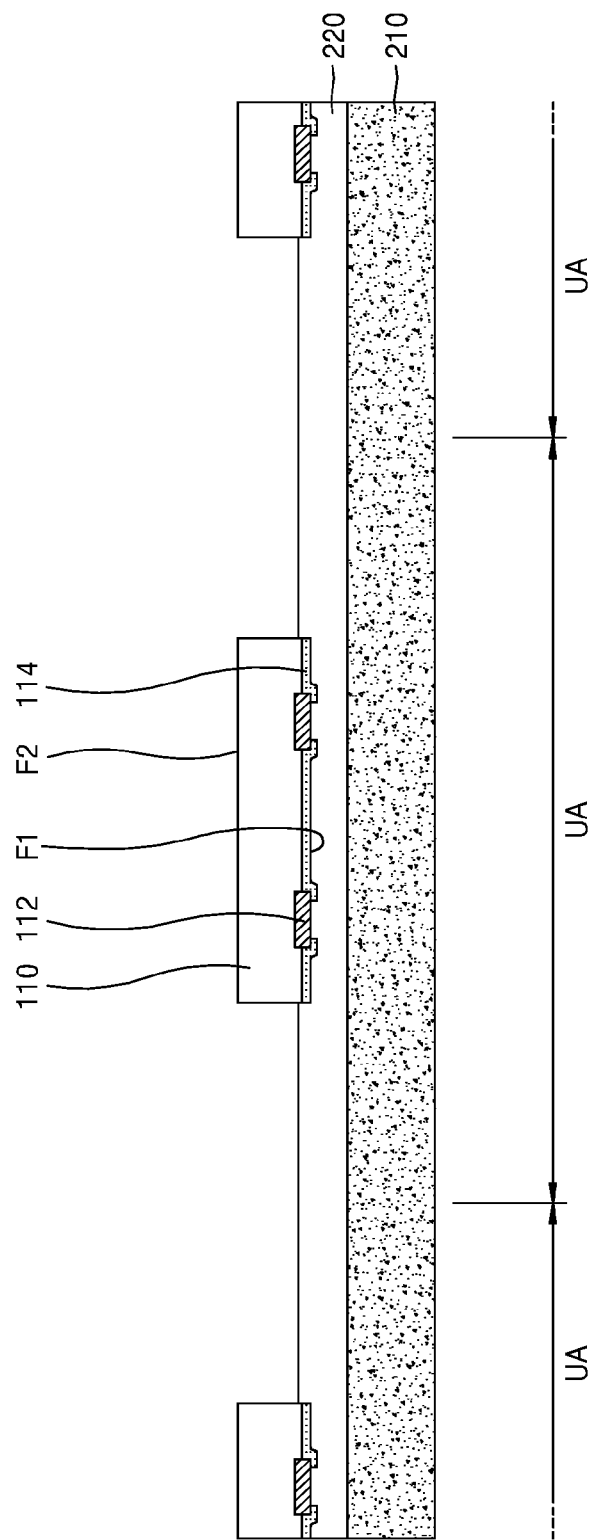

Referring to FIG. 10A, a first carrier substrate 210 and a first adhesive member 220 may be provided.

The first carrier substrate 210 may include a plurality of unit areas UA, and each of the plurality of unit areas UA may be an area for mounting one semiconductor chip 110.

The first adhesive member 220 may be attached on an entire area of the first carrier substrate 210. The first adhesive member 220 may include, for example, a light-heat conversion material that converts light energy by laser irradiation into thermal energy. For example, the first adhesive member 220 may include an organic material including a laser-absorbing material. Also, the first adhesive member 220 may include a thermoplastic material such as an acrylic resin, or an ultraviolet (UV) sensitive material.

After that, the semiconductor chip 110 may be attached on the first adhesive member 220. The semiconductor chip 110 may include the first surface F1 and the second surface F2 opposite to the first surface F1, and the first surface F1 may contact the first adhesive member 220.

The conductive pad 112 and the first protective layer 114 may be exposed to the first surface F1 of the semiconductor chip 110, and the conductive pad 112 and the first protective layer 114 may therefore contact the first adhesive member 220.

Referring to FIG. 10B, the preliminary connection via structure 30 may be disposed around the semiconductor chip 110 (e.g., outside of lateral surfaces of the semiconductor chip 110). The preliminary connection via structure 30 may be the preliminary connection via structure 30 manufactured according to the manufacturing method described with reference to FIGS. 7A to 7D. Also, the preliminary connection via structure 30 may be replaced by the preliminary connection via structure 30A manufactured by the manufacturing method described with reference to FIGS. 8A and 8B, and replaced by the preliminary connection via structure 30B manufactured by the manufacturing method described with reference to FIGS. 9A and 9B.

The preliminary connection via structure 30 may include the support portion 32 and the connection via portion 34. The preliminary connection via structure 30 may be disposed such that the bottom surface of the connection via portion 34 may contact the first adhesive member 220 and the upper surface of the support portion 32 may be located in the upper portion of the preliminary connection via structure 30. In certain embodiments, a terminal end of the connection vias of the connection via portion may be disposed in the first adhesive member 220, such that the top surface of the adhesive member 220 is above a bottom surface of the connection vias. Also, the support portion 32 has an opening 32H, and the preliminary connection via structure 30 may be disposed such that the opening 32H may be located in a location that vertically overlaps the semiconductor chip 110. Accordingly, the upper surface of the semiconductor chip 110 (e.g., the second surface F2) may not be covered with the preliminary connection via structure 30.

Figure 10C:
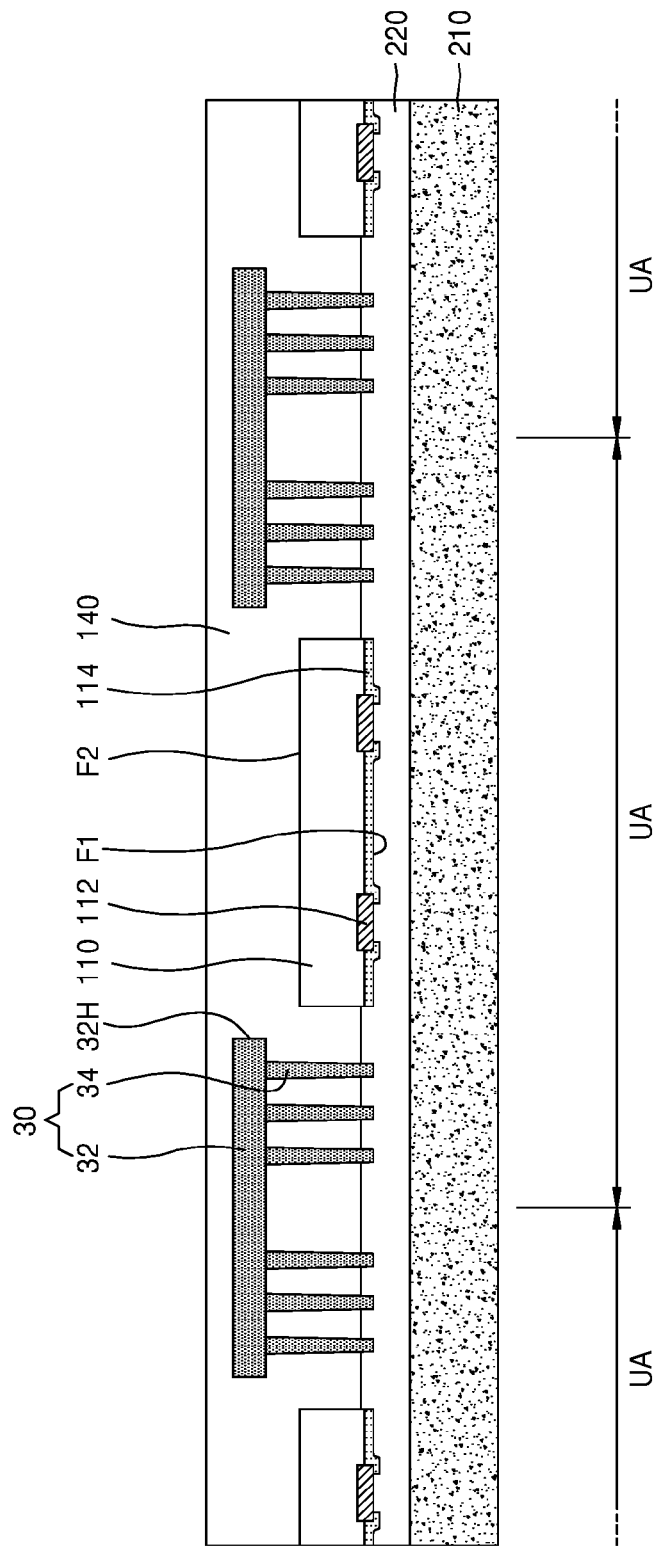

Referring to FIG. 10C, the molding member 140 surrounding exposed surfaces of the semiconductor chip 110 and the preliminary connection via structure 30 is formed.

According to an example embodiment, the molding member 140 may include an insulating material such as an EMC.

In an exemplary process of forming the molding member 140, the first carrier substrate 210 on which the semiconductor chip 110 and the preliminary connection via structure 30 have been attached may be disposed inside a mold (not shown). The molding member 140 surrounding the lateral surfaces and the upper surfaces of the semiconductor chip 110 and the preliminary connection via structure 30 may be formed by injecting a molding material (not shown) into a space limited by the mold, and hardening the molding material. Therefore, the molding member 140 may include a single material layer.

Figure 10D:
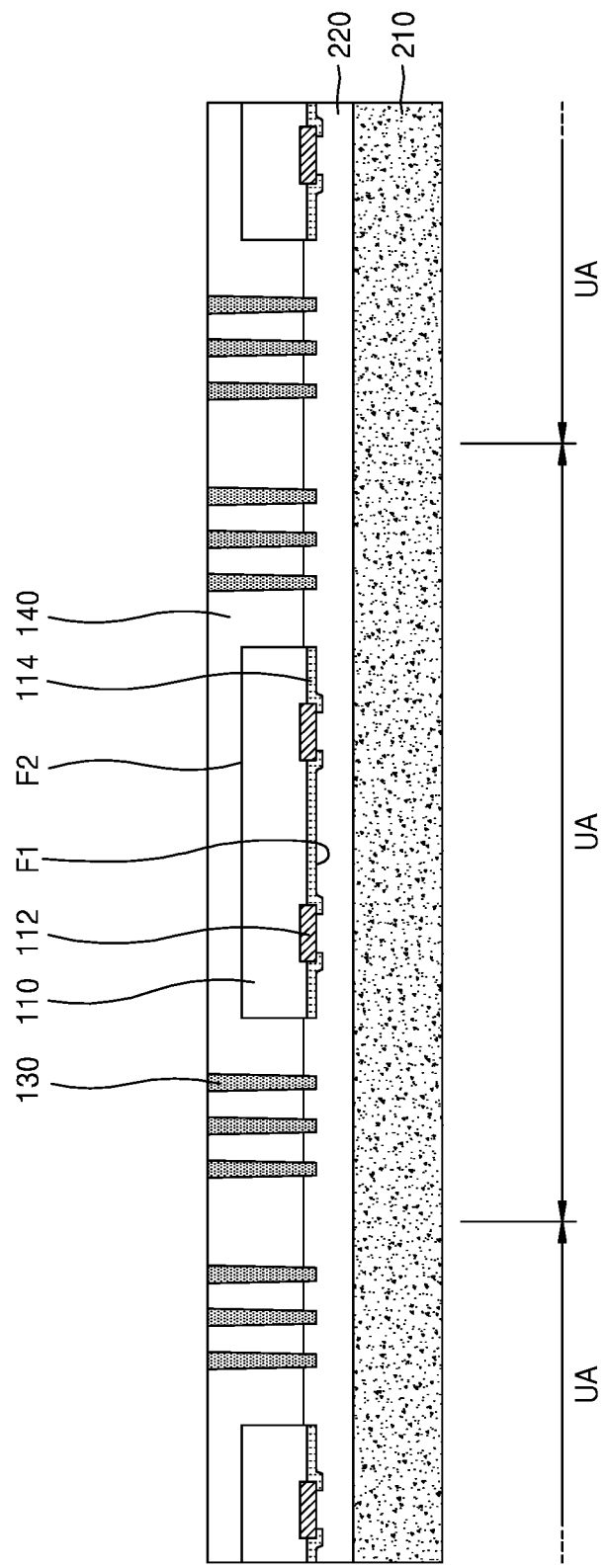

Meanwhile, since the support portion 32 includes the opening 32H and the upper surface (e.g., the second surface F2) of the semiconductor chip 110 is disposed at a location that vertically overlaps the opening 32H, the molding material may be injected into a space between the semiconductor chip 110 and the preliminary connection via structure 30 through the opening 32H, and thus the molding material may surround the exposed surfaces of the semiconductor chip 110 and the preliminary connection via structure 30 without void. Referring to FIG. 10D, the upper portion of the molding member 140 may be removed, for example, by performing a grinding process on the upper portion of the molding member 140. During the grinding process, the support portion 32 (see FIG. 10C) of the preliminary connection via structure 30 (see FIG. 10C) may be removed together with the upper portion of the molding member 140, and only the connection via portion 34 (see FIG. 10C) may remain, so that the connection via 130 may be formed.

After the grinding process, the upper surface of the molding member 140 may be located at the same level as the upper surface of the connection via 130, and may be coplanar with the upper surface of the connection via 130. Thus, a top surface of the connection via 130 may extend to a level of the top surface of the molding member 140. Also, as shown in FIG. 10D, in certain embodiments, a portion of the connection vias 130 (e.g., a bottom portion opposite upper surface) extends beyond a lower surface of the molding member 140 so that it is not coplanar with the lower surface of the molding member 140.

Figure 10E:
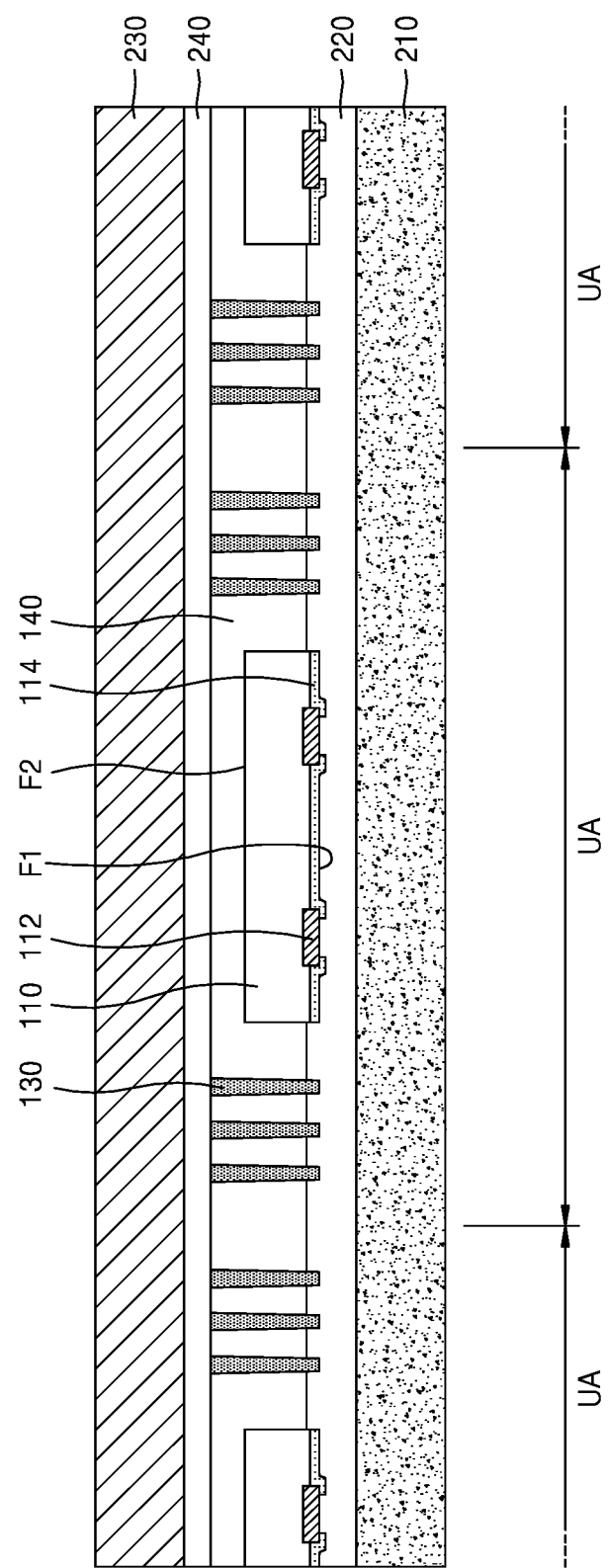

Referring to FIG. 10E, a second carrier substrate 230 is attached on the upper surface of the molding member 140. A second adhesive member 240 may be disposed between the second carrier substrate 230 and the molding member 140, so that the second carrier substrate 230 can be attached on the molding member 140.

Accordingly, a structure in which the first carrier substrate 210 faces the second carrier substrate 230 with the molding member disposed therebetween may be formed.

Figure 10F:
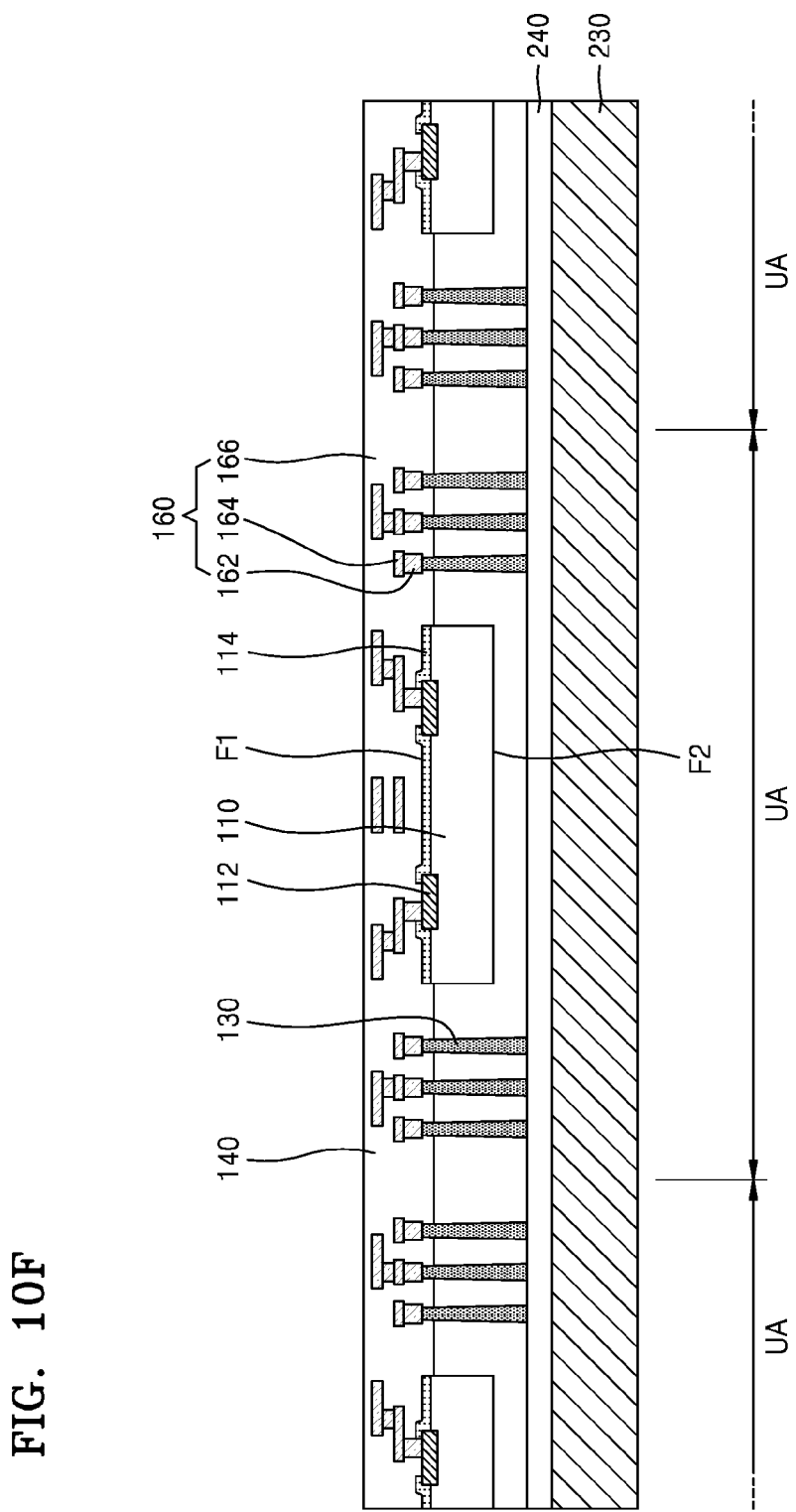

Referring to FIG. 10F, the first carrier substrate 210 (see FIG. 10E) is separated from the molding member 140 and the semiconductor chip 110.

In an exemplary process of separating the first carrier substrate 210, an appropriate method may be performed depending on a material and a characteristic of the first adhesive member 220 (see FIG. 10E). For example, in the case where the first adhesive member 220 includes an organic material including a laser-absorbing material, the first carrier substrate 210 may be separated from the molding member 140 and the semiconductor chip 110 by irradiating a laser onto the upper surface of the first carrier substrate 210 and partially melting the first adhesive member 220. Otherwise, various methods such as irradiating UV onto the upper portion of the first carrier substrate 210, or heating the upper portion of the first carrier substrate 210 may be used.

After the first carrier substrate 210 is separated, the molding member 140, the first surface F1 of the semiconductor chip 110, and the upper surfaces of the connection vias 130 may be exposed. In this case, the upper surface of the conductive pad 112 of the semiconductor chip 110 may be also exposed. Also, the ends of the connection vias 130 may protrude past a surface of the molding member 140.

Selectively, a washing process may be further performed on the exposed molding member 140, first surface F1 of the semiconductor chip 110, and surfaces of the connection vias 130.

After that, the redistribution layer 160 may be formed on the exposed molding member 140, first surface F1 of the semiconductor chip 110, and surfaces of the connection vias 130.

In an exemplary process of forming the redistribution layer 160, a first insulating layer (not shown) covering the exposed molding member 140, first surface F1 of the semiconductor chip 110, and surfaces of the connection vias 130 may be formed, and a first opening (not shown) exposing the upper surface of the conductive pad 112 and the upper surface of the connection via 130 may be formed. A first conductive layer (not shown) filling the first opening may be formed on the first insulating layer, and the redistribution plug 162 contacting the upper surface of the conductive pad 112 and the upper surface of the connection via 130, and the redistribution pattern 164 integrally connected to the redistribution plug 162 may be formed by patterning the first conductive layer. After that, a second insulating layer (not shown) covering the upper surface of the redistribution pattern 164 may be formed, and a second opening (not shown) exposing a portion of the upper surface of the redistribution pattern 164 may be formed. A second conductive layer (not shown) filling the second opening may be formed on the second insulating layer, and another redistribution plug 162 contacting the upper surface of the redistribution pattern 164, and another redistribution pattern 164 integrally connected to the other redistribution plug 162 may be formed by patterning the second conductive layer. A third insulating layer (not shown) covering the other redistribution pattern 164 may be further formed. Here, the first to third insulating layers may be referred to as the redistribution insulating layer 166, and thus the redistribution layer 160 including the redistribution plug 162, the redistribution pattern 164, and the redistribution insulating layer 166 may be formed. However, a process of forming the redistribution layer 160 is not limited thereto.

Figure 10G:
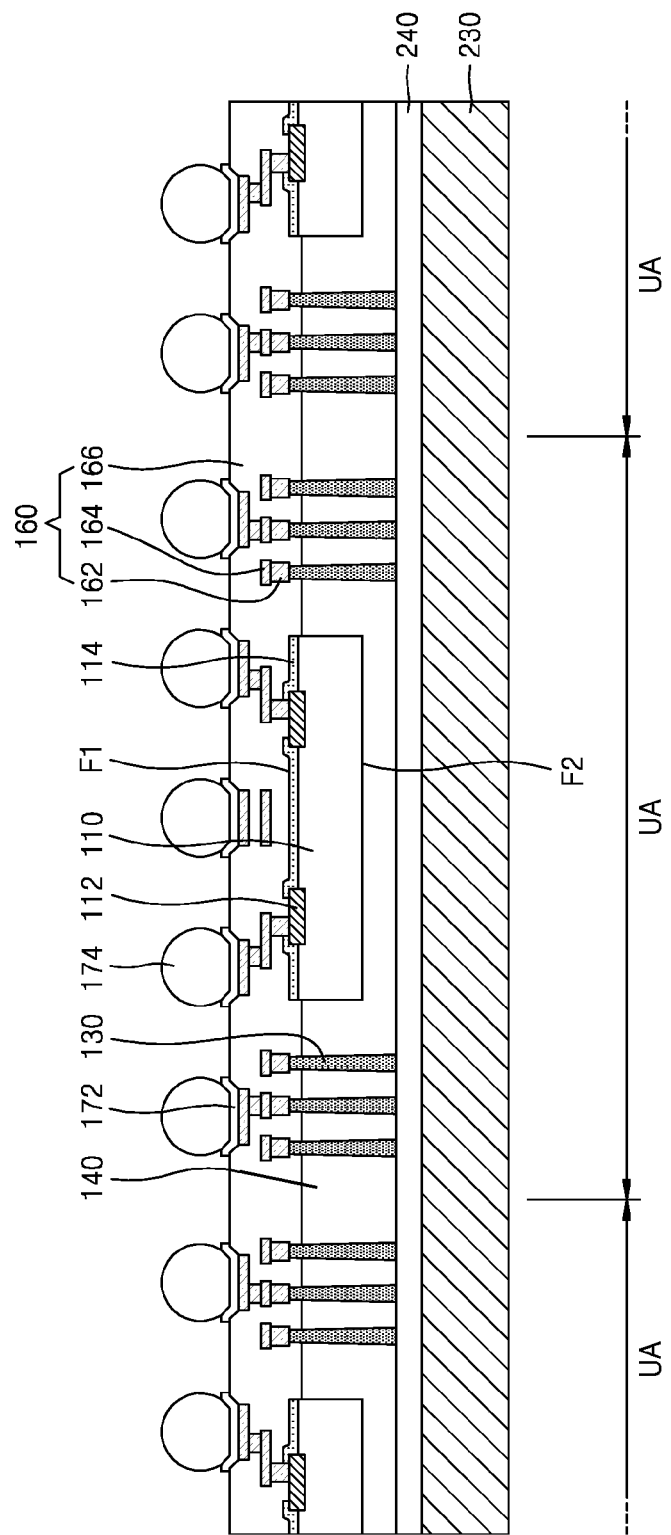

Referring to FIG. 10G, a portion of the upper surface of the redistribution pattern 164 may be exposed by removing a portion of the redistribution insulating layer 166, and a UBM layer 172 may be formed on the exposed portion of the upper surface of the redistribution pattern 164. A connection terminal 174 may be attached on the upper surface of the UBM layer 172. As such, a first set of external connection terminals may be connected to a first set of redistribution patterns electrically connected to pads at the first surface of the semiconductor chip, and a second set of external connection terminals may be connected to a second set of redistribution patterns electrically connected to the plurality of through-molding conductive vias.

After that, the semiconductor chip package 100 (see FIG. 1B) may be completed by individualizing a structure on which the connection terminal 174 has been attached on a unit area basis (e.g., by singulating the chips from each other). After that, the second carrier substrate 230 may be separated from the semiconductor chip package 100. In certain embodiments, the singulation may occur after a second set of chips and/or packages are mounted on the semiconductor chip packages 100 at the wafer level. For example, the carrier substrate 230 may be removed first, followed by mounting a second set of chips and/or packages on the packages 100 in wafer form to connect to top surfaces of the connection vias 130. After additional manufacturing steps are undertaken to form multi-chip packages or package-on-package devices, the packages may be singulated from each other to form a plurality of separate packages 100.

According to the method of manufacturing the semiconductor chip package 100, the preliminary connection via structure 30 including the connection via portion 34 having a fine pitch is mounted around the semiconductor chip 110, and then the molding member 140 surrounding the semiconductor chip 110 and the preliminary connection via structure 30 is formed. Accordingly, the semiconductor chip package 100 may include the connection via 130 having the fine pitch. As described above, in some embodiments, a plurality of through-molding conductive vias of a semiconductor package are formed outside of lateral surfaces of a semiconductor chip of the package, and subsequent to forming of the through-molding conductive vias, a molding layer is formed to surround the through-molding conductive vias. In addition, subsequent to forming the molding layer, a package substrate can be formed on the semiconductor chip and the molding layer. Due to this process, through-molding conductive vias can be formed that have a smaller pitch than in prior art methods. For example, pitches less than 100 micrometers and as small as 10 micrometers can be realized. As such, a semiconductor device such as a package or package-on-package can be provided that includes a package substrate, one or more semiconductor chips, a molding layer, and through-molding vias formed around lateral surfaces of the one or more semiconductor chips, that has a higher yield than traditional packages. Though an example of one semiconductor chip is given in the various embodiments, a plurality of stacked semiconductor chips may be included in the package, and placed in the location of the semiconductor chip 110 shown in the various embodiments. The package may be connected through the through-molding conductive vias to another package in a stacked manner.

Unlike FIG. 10B, in the case of disposing the preliminary connection via structure 30A illustrated in FIG. 8B around the semiconductor chip 110 and performing a molding process, the semiconductor chip package 100D described with reference to FIG. 5 may be manufactured.

FIGS. 11A to 11E are cross-sectional views illustrating a method of manufacturing a semiconductor chip package according to an exemplary embodiment. The manufacturing method may be the method of manufacturing the semiconductor chip package 100B described with reference to FIG. 4. In FIGS. 11A to 11E, reference numerals that are the same as those in FIGS. 1A to 10G denote the same components.

Figure 11A:
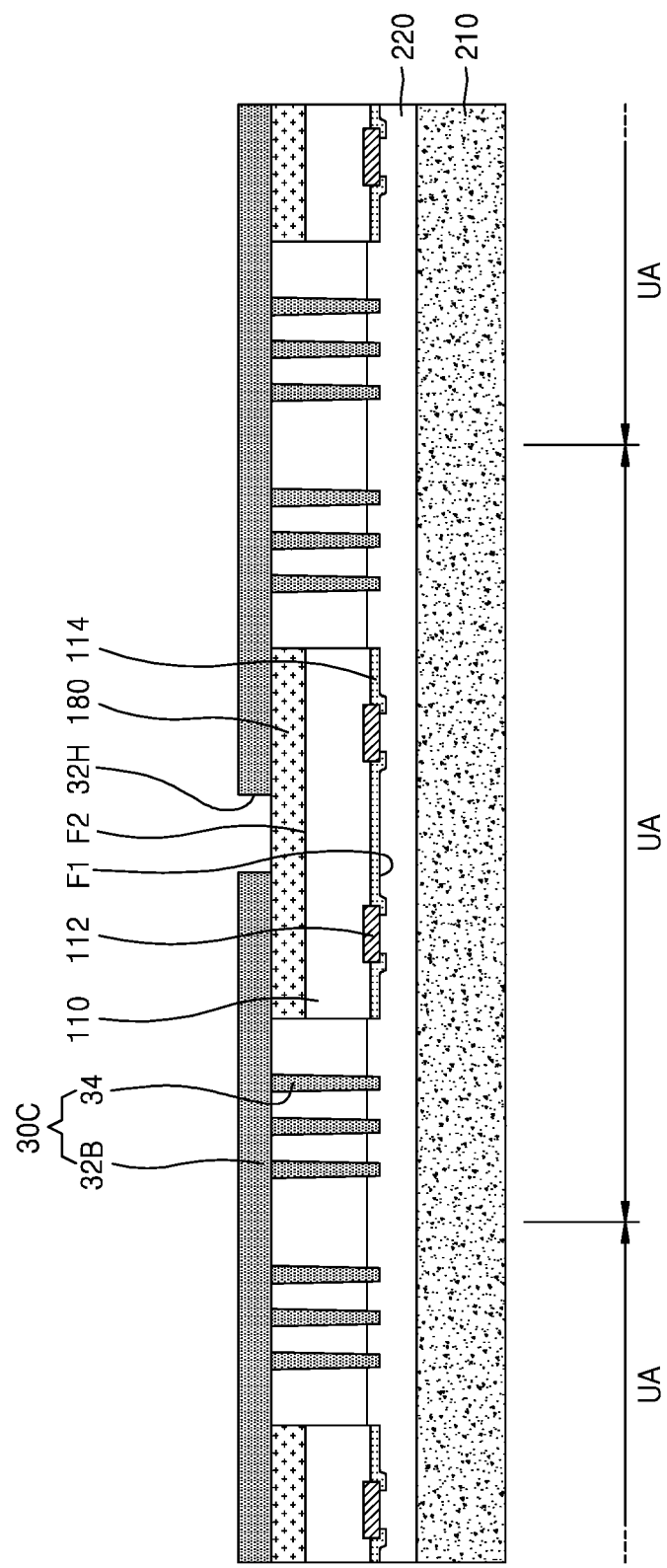

Referring to FIG. 11A, the semiconductor chip 110 may be attached on the first carrier substrate 210 and the first adhesive member 220. The first surface F1 of the semiconductor chip 110 may contact the first adhesive member 220, and the second protective layer 180 may be attached on the second surface F2 of the semiconductor chip 110. Here, for convenience of description, the upper surface of the second protective layer 180 is referred to as the second surface F2 of the semiconductor chip 110.

A preliminary connection via structure 30C may be attached on the semiconductor chip 110. The preliminary connection via structure 30C may include a support portion 32B and the connection via portion 34, and the support portion 32B may include an opening 32H. The opening 32H may be disposed in a location that vertically overlaps a portion of the semiconductor chip 110. The width of the opening 32H may be less than the width of the semiconductor chip 110, and thus a portion of the second surface F2 of the semiconductor chip 110 may be covered with the support portion 32B.

Referring to FIG. 11B, the molding member 140 surrounding the semiconductor chip 110 and the exposed surfaces of the preliminary connection via structure 30C may be formed.

After that, the upper portion of the molding member 140 may be removed by performing a grinding process on the upper portion of the molding member 140. During the grinding process, a predetermined height from the upper surface of the support portion 32B of the preliminary connection via structure 30C may be removed, and the height of the support portion 32B may be reduced.

Figure 11C:
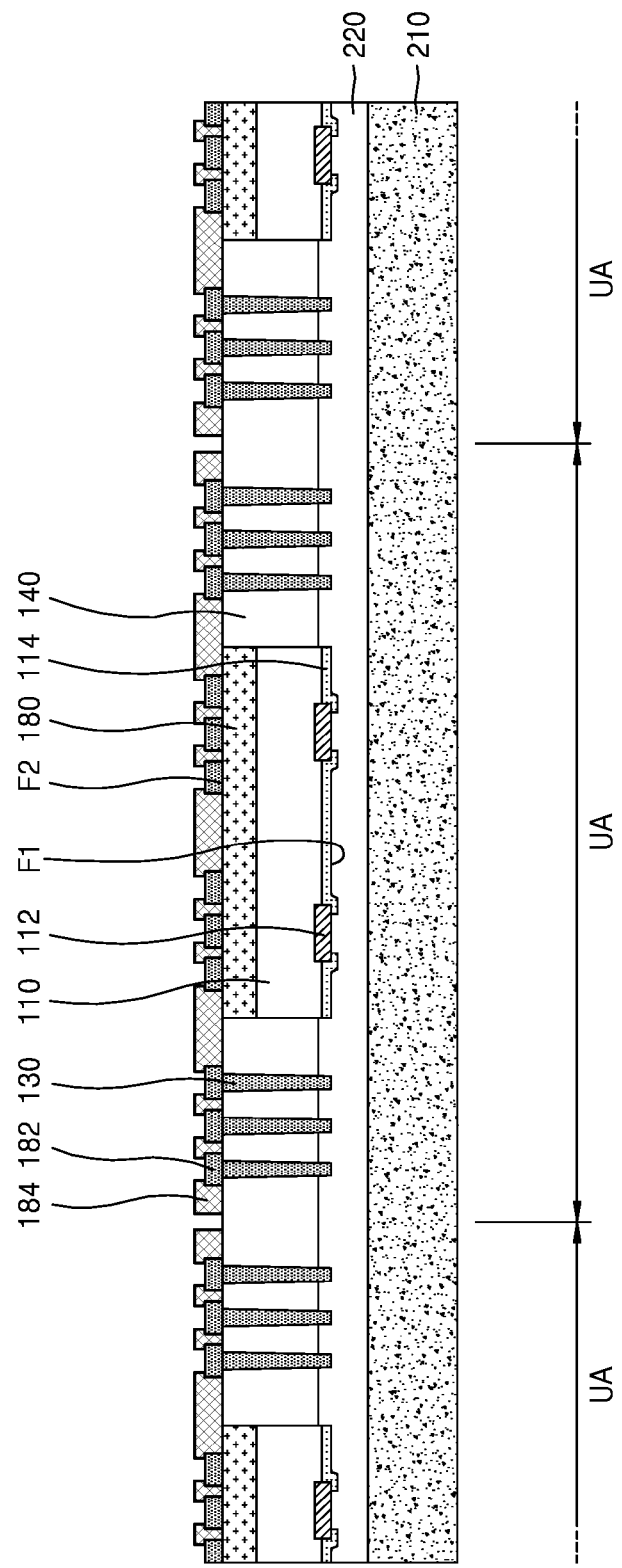

Referring to FIG. 11C, after a second mask pattern (not shown) is formed on the support portion 32B (see FIG. 11B), the wiring pattern 182 may be formed by patterning the support portion 32B by using the second mask pattern as an etching mask. The patterning may include, for example, removing a portion of the support portion 32B corresponding to wiring patterns, and removing a portion of the support portion 32B between unit areas UA. After that, the third protective layer 184 may be formed by forming an insulating layer (not shown) covering the wiring pattern 182, forming a third mask pattern (not shown) on the insulating layer, and then patterning the insulating layer by using the third mask pattern as an etching mask.

In this case, since the wiring pattern 182 is formed by patterning the support portion 32B, the wiring pattern 182 located above the connection via 130 may be integrally formed with the connection via 130. The wiring pattern 182 may be formed at a first vertical region above the top surface of the semiconductor chip 110, and may be physically connected to the conductive via 130 at the first vertical region. Also, since the second protective layer 180 is disposed on the semiconductor chip 110, and the support portion 32B is disposed on the second protective layer 180, the wiring pattern 182 located above the semiconductor chip 110 may not be electrically connected to the semiconductor chip 110 due to the second protective layer 180.

Figure 11D:
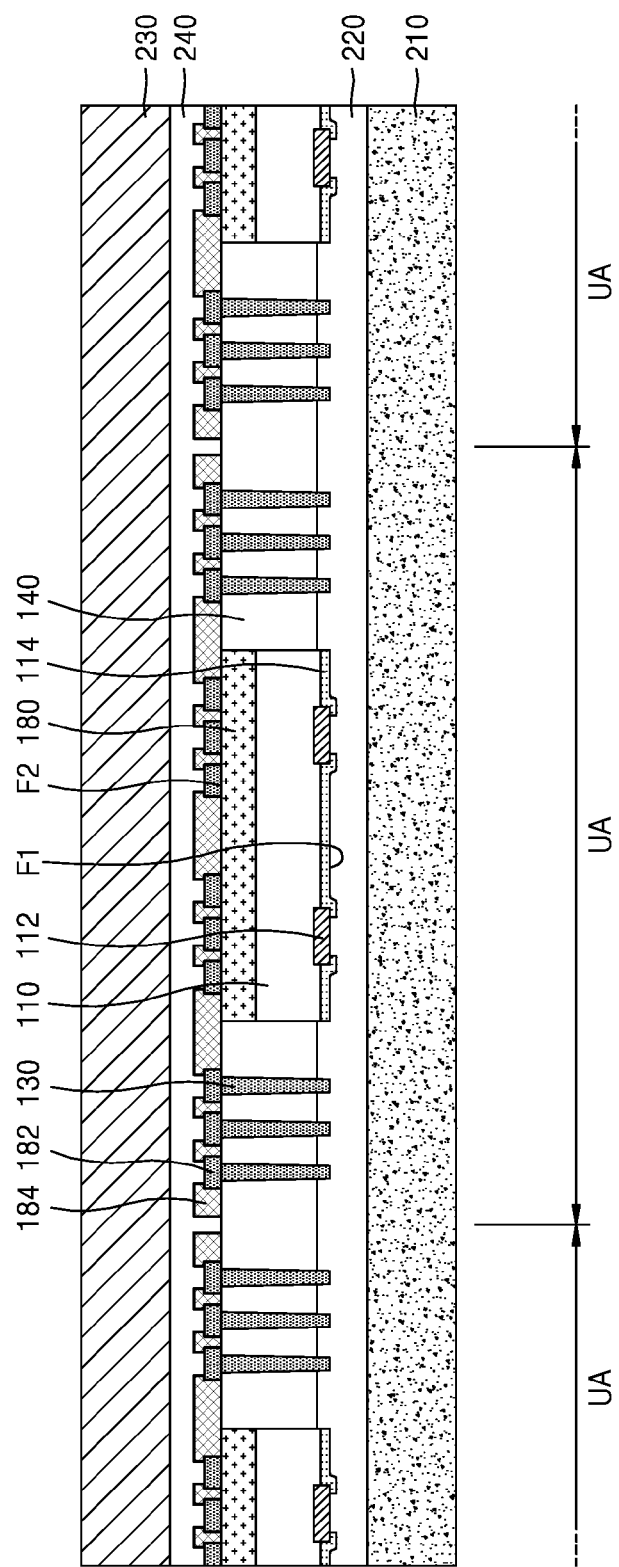

Referring to FIG. 11D, the second carrier substrate 230 may be attached on the wiring pattern 182 and the third protective layer 184 by using the second adhesive member 240.

Figure 11E:
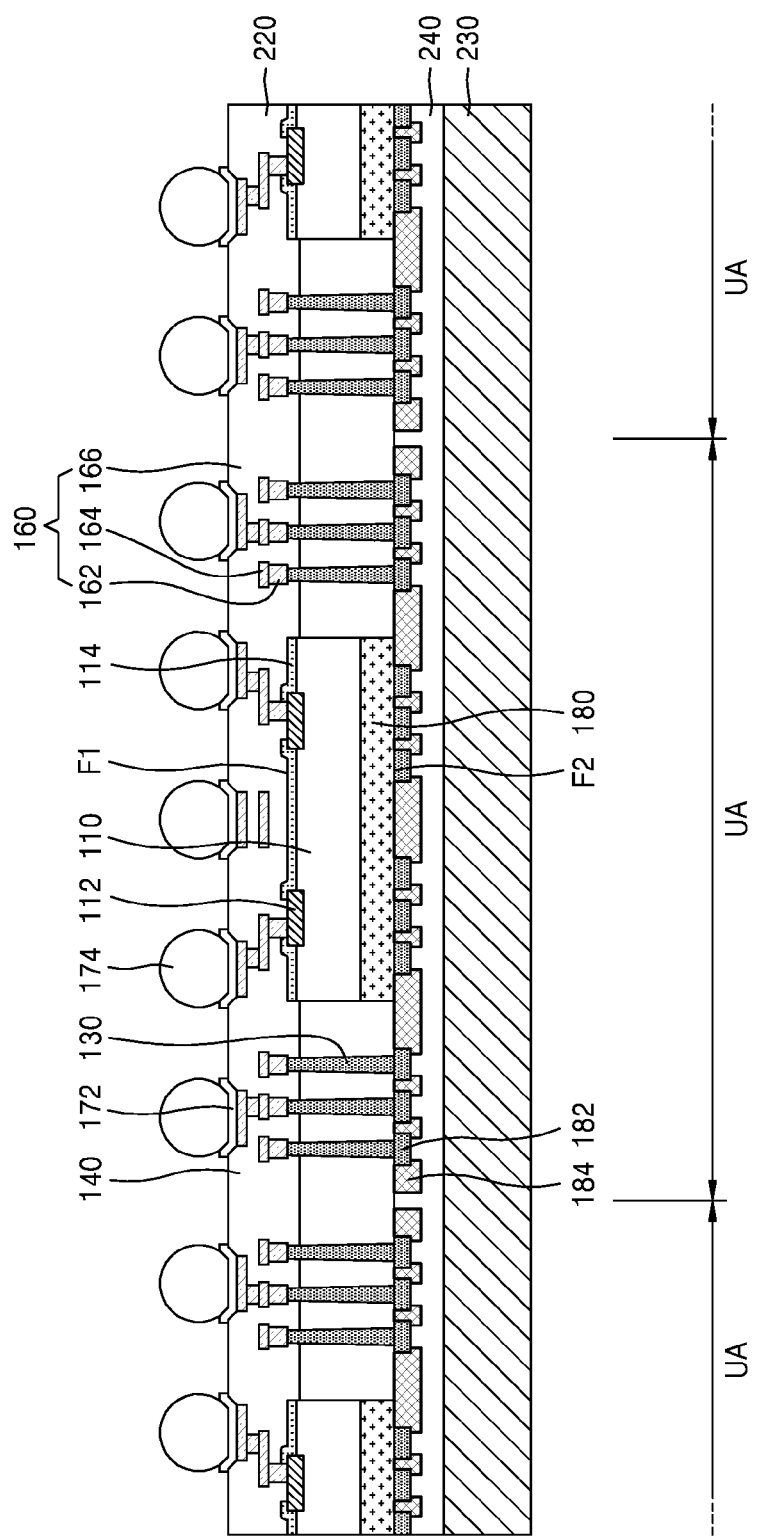

After that, the structure illustrated in FIG. 11E is formed by performing a process described with reference to FIGS. 10F and 10G.

After that, the semiconductor chip package 100B (see FIG. 3A) may be completed by individualizing a structure on which the connection terminal 174 has been attached on a unit area basis, and/or by first forming additional devices on the semiconductor chip package 100B at the wafer level, and then singulating the packages from each other.

Figure 12A:
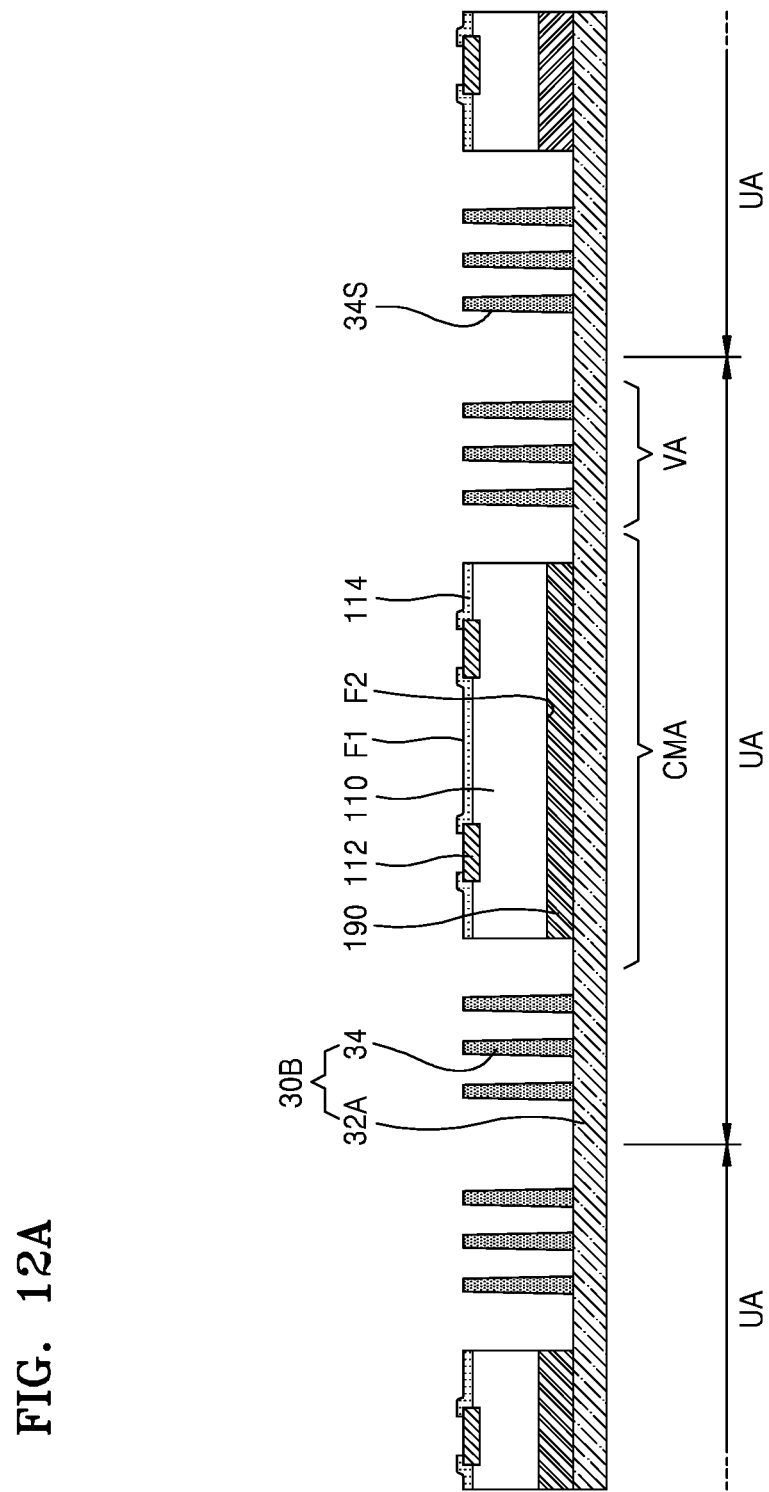
FIGS. 12A to 12C are cross-sectional views illustrating a method of manufacturing a semiconductor chip package according to an example embodiment.
Figure 12B:
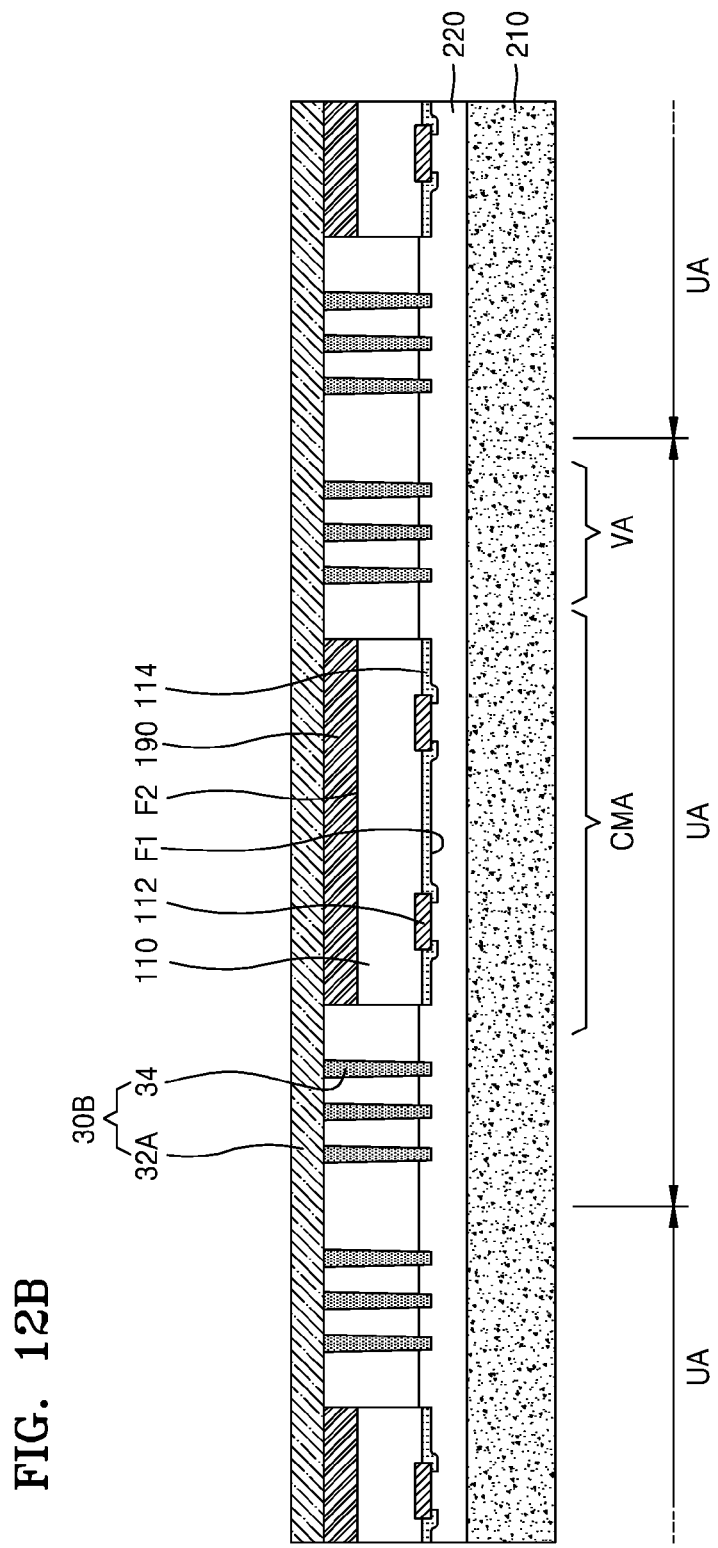
Figure 12C:
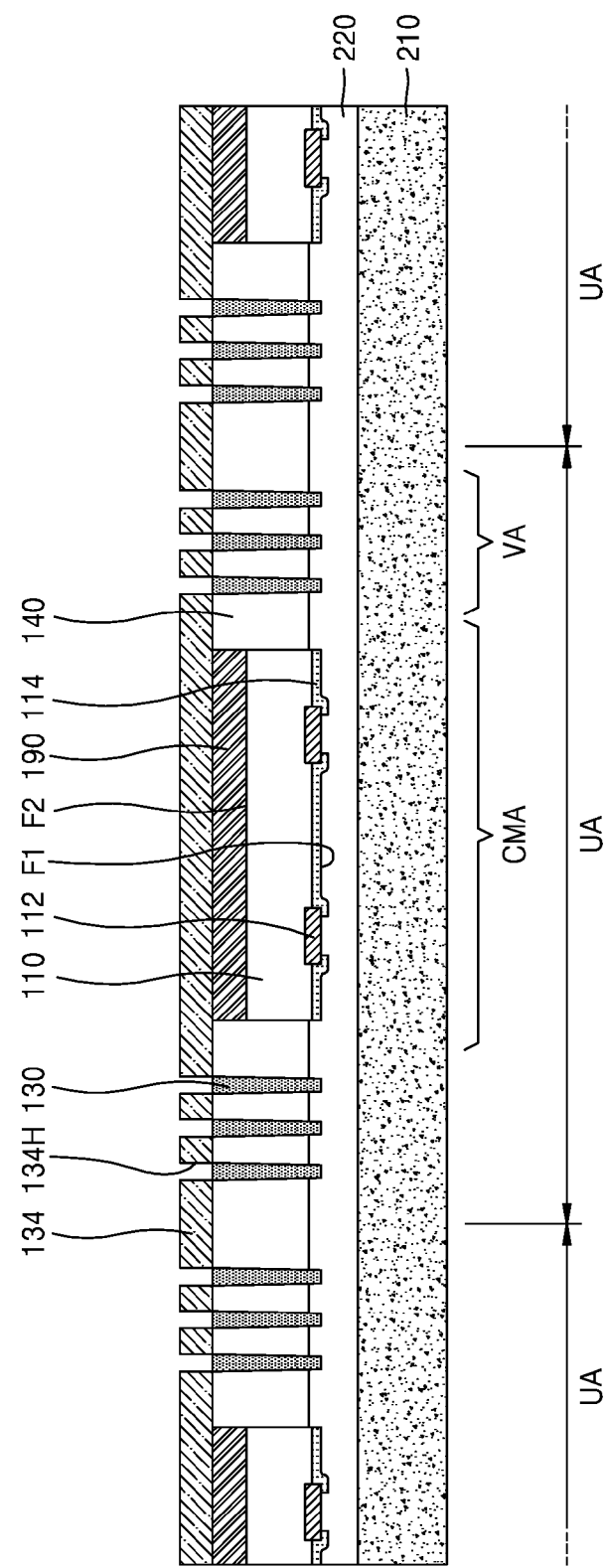

FIGS. 12A to 12C are cross-sectional views illustrating a method of manufacturing a semiconductor chip package according to an example embodiment. The manufacturing method may be the manufacturing method of the semiconductor chip package 100E described with reference to FIG. 6. In FIGS. 12A to 12C, reference numerals that are the same as those in FIGS. 1A to 11E denote the same components.

Referring to FIG. 12A, the semiconductor chip 110 may be mounted on the preliminary connection via structure 30B.

The preliminary connection via structure 30B may include an insulating support portion 32A and the connection via portion 34, and the semiconductor chip 110 may be mounted on a portion of the insulating support portion 32A that corresponds to the semiconductor mounting area CMA.

The semiconductor chip 110 may be attached on the insulating support portion 32A by using a die attach film (DAF) 190. In this case, the semiconductor chip 110 may be mounted so that the first surface F1, which is an active surface of the semiconductor chip 110, may face upward, that is, the semiconductor chip 110 may be mounted in a face-up manner. Accordingly, the second surface F2 opposite to the first surface F1 of the semiconductor chip 110 may be attached on the insulating support portion 32A by using the DAF 190.

The connection via portion 34 may extend in a direction perpendicular to the first surface F1 of the semiconductor chip 110 in the vicinity of the semiconductor chip 110. In this case, the upper surface of the connection via portion 34 may be located on a level that is equal to or higher than a level of the first surface F1 of the semiconductor chip 110.

Referring to FIG. 12B, the preliminary connection via structure 30B on which the semiconductor chip 110 has been mounted may be attached on the first carrier substrate 210 by using the first adhesive member 220. Here, the first surface F1 of the semiconductor chip 110 and the bottom portion of the connection via portion 34 (that is, the other end portion of the connection via portion 34 that is opposite to one end portion of the connection via portion 34 that is connected to the insulating support portion 32A) may contact the first adhesive member 220. A portion of the connection via portion 34 may be formed in the first adhesive member 220.

Referring to FIG. 12C, the molding member 140 covering the semiconductor chip 110, the connection via portion 34, and the exposed surfaces of the insulating support portion 32A may be formed, and the upper surface of the molding member 140 may be ground until the upper surface of the insulating support portion 32A is exposed.

The upper surface of the connection via 130 may be exposed by forming a fourth mask pattern (not shown) on the insulating support portion 32A and removing a portion of the insulating support portion 32A by using the fourth mask pattern as an etching mask. Accordingly, the insulating frame 134 including the opening 134H that exposes the upper surface of the connection via 130 may be formed.

Here, the connection via portion 34 is separated from the insulating frame 134 by the opening 134H, so that the connection via 130 may be formed. The lateral wall of the connection via 130 may be surrounded by the molding member 140, and the upper surface of the molding member 140 may contact the insulating frame 134.

After that, the semiconductor chip package 100E illustrated in FIG. 6 may be completed by performing the processes described with reference to FIGS. 10E to 10G.

As discussed above, in some embodiments, a semiconductor device including a package substrate, at least one semiconductor chip, and a plurality of through-molding conductive vias formed through a molding layer may be formed such that a second semiconductor chip or package can be stacked on a first semiconductor chip or package using the through-molding vias to electrically connect a re-distribution layer on the second semiconductor chip or package to a wiring or redistribution layer in the package substrate. In some embodiments, a manufacturing process may allow the through-molding conductive vias to be formed with a very fine pitch. For example, the manufacturing process may include forming the through-molding conductive vias before forming the molding layer that surrounds them. Also, the through-molding conductive vias may be formed of a single, continuous structure that extends beyond a top surface of the molding layer, and that may be integrally formed with a wiring pattern formed at a top surface of the molding layer.

While the inventive concept has been particularly shown and described with reference to example embodiments thereof, it will be understood that various changes in form and details may be made therein without departing from the spirit and scope of the following claims.

What is claimed is:

1. A method of manufacturing a semiconductor chip package, the method comprising:
   attaching a semiconductor chip on a carrier substrate;
   forming a preliminary connection via structure comprising a conductive connection via portion and a support portion integrally connected to the conductive connection via portion;
   attaching the preliminary connection via structure on the carrier substrate such that the conductive connection via portion is disposed laterally outside of the semiconductor chip;
   forming a molding member that surrounds the semiconductor chip and the preliminary connection via structure;
   forming a conductive connection via that passes through the molding member by removing an upper portion of the molding member and an upper portion of the preliminary connection via structure; and
   removing an upper portion of the molding member that surrounds an upper lateral wall of the conductive connection via such that an upper surface of the molding member is located on a level lower than an upper surface of the conductive connection via.

2. The method of claim 1, wherein the forming of the preliminary connection via structure is performed by an etching process that uses a mask pattern as an etching mask.

3. The method of claim 1, wherein the conductive connection via has a lateral wall inclined with an inclination angle with respect to an upper surface of the semiconductor chip.

4. The method of claim 1, wherein the removing of the upper portion of the molding member is performed by a laser irradiation process.

5. The method of claim 1, wherein the conductive connection via has a bottom surface, opposite the upper surface, that extends below a bottom surface of the molding member.

6. The method of claim 1, wherein the removing the upper portion of the preliminary connection via structure includes forming a wiring pattern by leaving a portion of the support portion of the preliminary connection via structure.

7. A method of manufacturing a semiconductor package, the method comprising:
   providing a package substrate having a first surface and a second surface opposite the first surface;
   providing a first semiconductor chip on the package substrate, the first semiconductor chip having a first surface facing the second surface of the package substrate, a second surface opposite the first surface of the first semiconductor chip, and lateral surfaces extending from the first surface of the first semiconductor chip to the second surface of the first semiconductor chip;
   providing a molding layer covering the lateral surfaces of the first semiconductor chip and covering the second surface of the package substrate;
   providing a plurality of through-molding conductive vias outside the lateral surfaces of the first semiconductor chip; and
   forming a wiring pattern at a first vertical region above the second surface of the first semiconductor chip,
   wherein the through-molding conductive vias are formed before forming the molding layer and pass through the molding layer,
   wherein the wiring pattern is electrically connected to a first through-molding conductive via of the plurality of through-molding conductive vias and is physically connected to the first through-molding conductive via at the first vertical region, and
   wherein the wiring pattern is integrally formed with the first through-molding conductive via.

8. The method of claim 7, further comprising:
   forming the package substrate on the first semiconductor chip and the molding layer after forming the molding layer.

9. The method of claim 7, further comprising:
   forming the molding layer to cover the second surface of the first semiconductor chip.

10. The method of claim 7, further comprising:
    providing redistribution patterns in the package substrate, wherein:
    a first set of the redistribution patterns is electrically connected to pads at the first surface of the first semiconductor chip, and
    a second set of the redistribution patterns is electrically connected to the plurality of through-molding conductive vias.

11. The method of claim 10, further comprising:
    forming a plurality of external connection terminals on the first surface of the package substrate, the plurality of external connection terminals including:
    a first set of external connection terminals connected to the first set of redistribution patterns; and
    a second set of external connection terminals connected to the second set of redistribution patterns.

12. The method of claim 10, wherein:
    the molding layer has a first surface contacting the second surface of the package substrate, and a second surface opposite the first surface;
    each of the plurality of through-molding conductive vias extends beyond the first surface of the molding layer.

13. The method of claim 12, wherein:
each of the plurality of through-molding conductive vias extends to or beyond the second surface of the molding layer.

14. A method comprising:
providing a package substrate having a first surface and a second surface opposite the first surface;
providing a first semiconductor chip on the package substrate, the first semiconductor chip having a first surface facing the second surface of the package substrate, a second surface opposite the first surface, and lateral surfaces extending from the first surface of the first semiconductor chip to the second surface of the first semiconductor chip;
providing a molding layer covering the lateral surfaces of the first semiconductor chip and covering the second surface of the package substrate, wherein a first surface of the molding layer faces the second surface of the package substrate; and
providing a plurality of through-molding conductive vias that pass through the molding layer and are located outside the lateral surfaces of the first semiconductor chip,
wherein the through-molding conductive vias extend beyond the first surface of the molding layer to outside of the molding layer.

15. The method of claim 14, wherein the through-molding conductive vias are formed before forming the molding layer.

16. The method of claim 14, further comprising:
forming the package substrate on the first semiconductor chip and the molding layer after forming the molding layer.

17. The method of claim 14, wherein each of the plurality of through-molding conductive vias extends to a second surface of the molding layer opposite the first surface of the molding layer.

18. The method of claim 14, wherein each of the plurality of through-molding conductive vias extends beyond a second surface of the molding layer opposite the first surface of the molding layer.

19. The method of claim 14, further comprising:
providing redistribution patterns in the package substrate, wherein:
a first set of the redistribution patterns is electrically connected to pads at the first surface of the first semiconductor chip, and
a second set of the redistribution patterns is electrically connected to the plurality of through-molding conductive vias.

20. The method of claim 19, further comprising:
forming a plurality of external connection terminals on the first surface of the package substrate, the plurality of external connection terminals including:
a first set of external connection terminals connected to the first set of redistribution patterns; and
a second set of external connection terminals connected to the second set of redistribution patterns.

\* \* \* \* \*